(12) United States Patent
Yang et al.

(10) Patent No.: US 12,222,383 B2
(45) Date of Patent: Feb. 11, 2025

(54) INSULATION RESISTANCE DETECTION CIRCUIT

(71) Applicant: DELTA ELECTRONICS, INC., Taoyuan (TW)

(72) Inventors: Li-Ching Yang, Taoyuan (TW); Wen-Lung Huang, Taoyuan (TW); Sheng-Hua Li, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 18/637,993

(22) Filed: Apr. 17, 2024

(65) Prior Publication Data

US 2024/0264218 A1    Aug. 8, 2024

Related U.S. Application Data

(62) Division of application No. 17/892,512, filed on Aug. 22, 2022, now Pat. No. 12,066,479.

(30) Foreign Application Priority Data

Mar. 22, 2022    (TW) .................................. 111110507

(51) Int. Cl.
*H01H 31/12*    (2006.01)
*G01R 31/14*    (2006.01)

(52) U.S. Cl.
CPC .................................. *G01R 31/14* (2013.01)

(58) Field of Classification Search
CPC ........ G01R 31/08; G01R 31/14; G01R 31/40; G01R 31/52; G01R 31/58; G01R 31/389;
(Continued)

(56) References Cited

U.S. PATENT DOCUMENTS

| 8,766,653 B2 | 7/2014 | Tu et al. |
| 10,890,612 B2 | 1/2021 | Lin et al. |

(Continued)

FOREIGN PATENT DOCUMENTS

| CN | ON103983857 A | 8/2014 |
| CN | 206020596 U | 3/2017 |

(Continued)

OTHER PUBLICATIONS

Search Report dated Jun. 29, 2023 of the corresponding European patent application No. 22189354.8.

*Primary Examiner* — Thang X Le
(74) *Attorney, Agent, or Firm* — Muncy, Geissler, Olds & Lowe P.C

(57) ABSTRACT

An insulation resistance detection circuit is coupled to a positive end and a negative end of a DC power source, and is used to detect a positive insulation resistance between the positive end and a ground point and detect a negative insulation resistance between the negative end and the ground point. A detection unit sets a first estimated resistance and a second estimated resistance, and acquires a first voltage based on turning on the switch and acquires a second voltage based on turning off the switch. The detection unit calculates a third voltage and a fourth voltage according to the first estimated resistance and the second estimated resistance so as to detect the positive insulation resistance and the negative insulation resistance when the third voltage is equal to the first voltage and the fourth voltage is equal to the second voltage.

11 Claims, 25 Drawing Sheets

(58) Field of Classification Search
CPC ...... G01R 27/025; G01R 27/16; G01R 27/18; G01R 27/20
See application file for complete search history.

(56) References Cited

U.S. PATENT DOCUMENTS

| | | | |
|---|---|---|---|
| 2007/0210805 A1* | 9/2007 | Kawamura | G01R 31/44 324/541 |
| 2013/0342215 A1* | 12/2013 | Kawamura | G01R 31/08 324/509 |
| 2015/0022219 A1* | 1/2015 | Kawamura | B60L 3/0069 324/551 |
| 2019/0011504 A1 | 1/2019 | Kim et al. | |
| 2019/0064279 A1 | 2/2019 | Dan | |
| 2019/0064280 A1 | 2/2019 | Sun | |
| 2020/0018786 A1 | 1/2020 | Lin | |
| 2022/0252657 A1 | 8/2022 | Guo | |
| 2023/0128107 A1* | 4/2023 | Jiang | G01R 31/006 324/551 |

FOREIGN PATENT DOCUMENTS

| | | | |
|---|---|---|---|
| CN | 108983105 A | 12/2018 | |
| CN | 109696581 A | 4/2019 | |
| CN | 111562469 A | 8/2020 | |
| CN | 112147477 A | 12/2020 | |
| CN | 112286500 A | 1/2021 | |
| CN | 113866504 A | 12/2021 | |

* cited by examiner

INSULATION RESISTANCE DETECTION CIRCUIT

CROSS-REFERENCE TO RELATED APPLICATION

This application is a divisional application of U.S. patent application Ser. No. 17/892,512, filed on Aug. 22, 2022, and entitled "INSULATION RESISTANCE DETECTION CIRCUIT AND METHOD OF DETECTING INSULATION RESISTANCE," which claims priority to TW111110507 filed on Mar. 22, 2022. The entire disclosures of the above applications are all incorporated herein by reference.

BACKGROUND

Technical Field

The present disclosure relates to an insulation resistance detection circuit and a method of detecting insulation resistance, and more particularly to an insulation resistance detection circuit and a method of detecting insulation resistance which can reduce the number of switches.

Description of Related Art

The statements in this section merely provide background information related to the present disclosure and do not necessarily constitute prior art.

As shown in FIG. 1A and FIG. 1B, which respectively show a circuit diagram of a first insulation resistance detection circuit and a second insulation resistance detection circuit in the related art. The DC power source Vdc may be the DC side of any power product (for example, but not limited to, the DC side of a solar panel, a battery, or multiple sets of power modules).

When the DC power source Vdc is available, the detection circuit detects the insulation resistance between the positive end of the DC power source Vdc and the ground point and between the negative end of the DC power source Vdc and the ground point.

As shown in FIG. 1A and FIG. 1B, the current practice is to use a Wheatstone bridge and use a detection resistor Rs to the parallel connection of the Wheatstone bridge to feedback the unbalanced voltage Vs of the bridge, and then calculate the insulation resistance between the positive end of the DC power source Vdc and the ground point and between the negative end of the DC power source Vdc and the ground point. Due to the characteristics of the Wheatstone bridge, the unbalanced voltage Vs responds to a small change in voltage so it is necessary to amplify the unbalanced voltage Vs. Therefore, a high-precision detection circuit is required, and since the feedback voltage is connected to the ground point and is floating, additional noise suppression processing must be performed. Since the number of switches used in the current architecture is more than two (the two-switch architecture shown in FIG. 1A and the four-switch architecture shown in FIG. 1B). Based on the number of switches, the feedback calculation formula and determination formula will be more complicated, and there is no advantage in price.

Accordingly, the present disclosure is to provide an insulation resistance detection circuit and a method of detecting insulation resistance to achieve the effect of reducing the number of switches and reducing the cost of the circuit.

SUMMARY

In order to solve the above-mentioned problem, the present disclosure provides an insulation resistance detection circuit. The insulation resistance detection circuit is coupled to a positive end and a negative end of a DC power source, and detects a positive insulation resistance between the positive end and a ground point, and a negative insulation resistance between the negative end and the ground point. The insulation resistance detection circuit includes a first resistance, a second resistance, a third resistance, and a fourth resistance coupled in series, a switch, and a detection unit. A first node between the second resistance and the third resistance is coupled to the ground point. The switch includes a first end and a second end. The first end is coupled to a second node between the first resistance and the second resistance, and the second node is coupled to a third node between the third resistance and the fourth resistance. The detection unit is coupled to any two of the positive end, the negative end, the first node, the second node, and the third node. The detection unit sets a first estimated resistance of the positive insulation resistance and a second estimated resistance of the negative insulation resistance, and acquires a first voltage based on turning on the switch and acquire a second voltage based on turning off the switch. The detection unit calculates a third voltage and a fourth voltage according to the first estimated resistance and the second estimated resistance so as to detect the positive insulation resistance and the negative insulation resistance when the third voltage is equal to the first voltage and the fourth voltage is equal to the second voltage.

In order to solve the above-mentioned problem, the present disclosure provides an insulation resistance detection circuit. The insulation resistance detection circuit is coupled to positive end and a negative end of a DC power source, and detects a positive insulation resistance between the positive end and a ground point, and a negative insulation resistance between the negative end and the ground point. The insulation resistance detection circuit includes a first resistance, a second resistance, a third resistance, and a fourth resistance coupled in series, a first circuit bypass capacitance and a second circuit bypass capacitance, a switch, and a detection unit. A first node between the second resistance and the third resistance is coupled to the ground point. The first circuit bypass capacitance is coupled in parallel to the first resistance and the second resistance in series, and the second circuit bypass capacitance is coupled in parallel to the third resistance and the fourth resistance in series. The switch includes a first end and a second end. The first end is coupled to a second node between the first resistance and the second resistance, and the second node is coupled to a third node between the third resistance and the fourth resistance. The detection unit is coupled to any two of the positive end, the negative end, the first node, the second node, and the third node. The first resistance and the second resistance are for the first circuit bypass capacitance discharging to the ground point, the third resistance and the fourth resistance are for the second circuit bypass capacitance discharging to the ground point.

In order to solve the above-mentioned problem, the present disclosure provides a method of detecting insulation resistance. A detection circuit detects a positive insulation resistance between a positive end of a DC power source and a ground point, and a negative insulation resistance between a negative end and the ground point. The detection circuit includes a first resistance, a second resistance, a third resistance, a fourth resistance coupled in series, and a switch. A first node between the second resistance and the third resistance is coupled to the ground point. The switch incudes a first end and a second end. The first end is coupled to a second node between the first resistance and the second resistance, and the second node is coupled to a third node between the third resistance and the fourth resistance. The method comprising steps of: setting a first estimated resistance of the positive insulation resistance and setting a second estimated resistance of the negative insulation resistance; turning on the switch, and detecting a first voltage at any two of the positive end, the negative end, the first node, the second node, and the third node; turning off the switch, and detecting a second voltage at any two of the positive end, the negative end, the first node, the second node, and the third node; calculating respectively a third voltage and a fourth voltage according to the first estimated resistance and the second estimated resistance; determining whether the third voltage is equal to the first voltage, and determining whether the fourth voltage is equal to the second voltage when the third voltage is equal to the first voltage; detecting the positive insulation resistance and the negative insulation resistance when the fourth voltage is equal to the second voltage.

The main purpose and effect of the present disclosure is to use only a single switch to form an insulation resistance detection circuit to detect insulation resistance so as to simplify the circuit structure and reduce the circuit cost.

It is to be understood that both the foregoing general description and the following detailed description are exemplary, and are intended to provide further explanation of the present disclosure as claimed. Other advantages and features of the present disclosure will be apparent from the following description, drawings, and claims.

BRIEF DESCRIPTION OF DRAWINGS

The present disclosure can be more fully understood by reading the following detailed description of the embodiment, with reference made to the accompanying drawing as follows:

FIG. 2B is a circuit diagram when a switch in FIG. 2A is turned on.

FIG. 3B is a circuit diagram when a switch in FIG. 3A is turned on.

FIG. 4B is a circuit diagram when a switch in FIG. 4A is turned on.

FIG. 5B is a circuit diagram when a switch in FIG. 5A is turned on.

FIG. 6B is a circuit diagram when a switch in FIG. 6A is turned on.

FIG. 7B is a circuit diagram when a switch in FIG. 7A is turned on.

FIG. 8B is a circuit diagram when a switch in FIG. 8A is turned on.

DETAILED DESCRIPTION

Figure 1A:
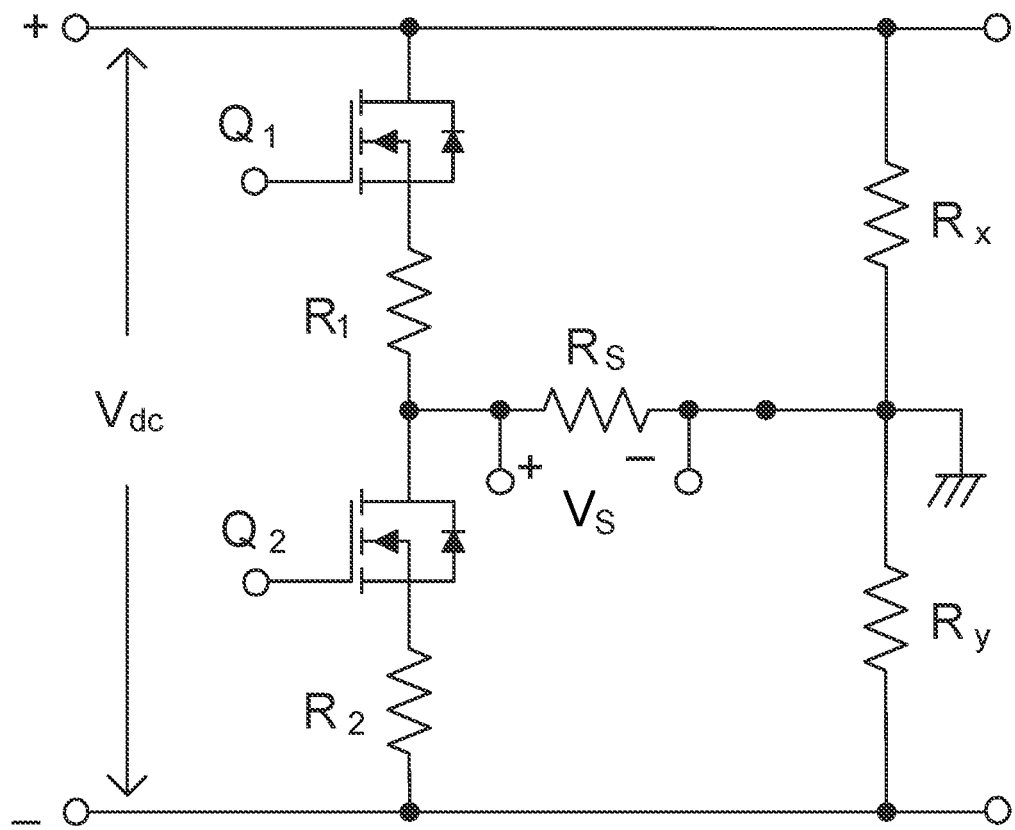
FIG. 1A is a circuit diagram of a first insulation resistance detection circuit in the related art.
Figure 1B:
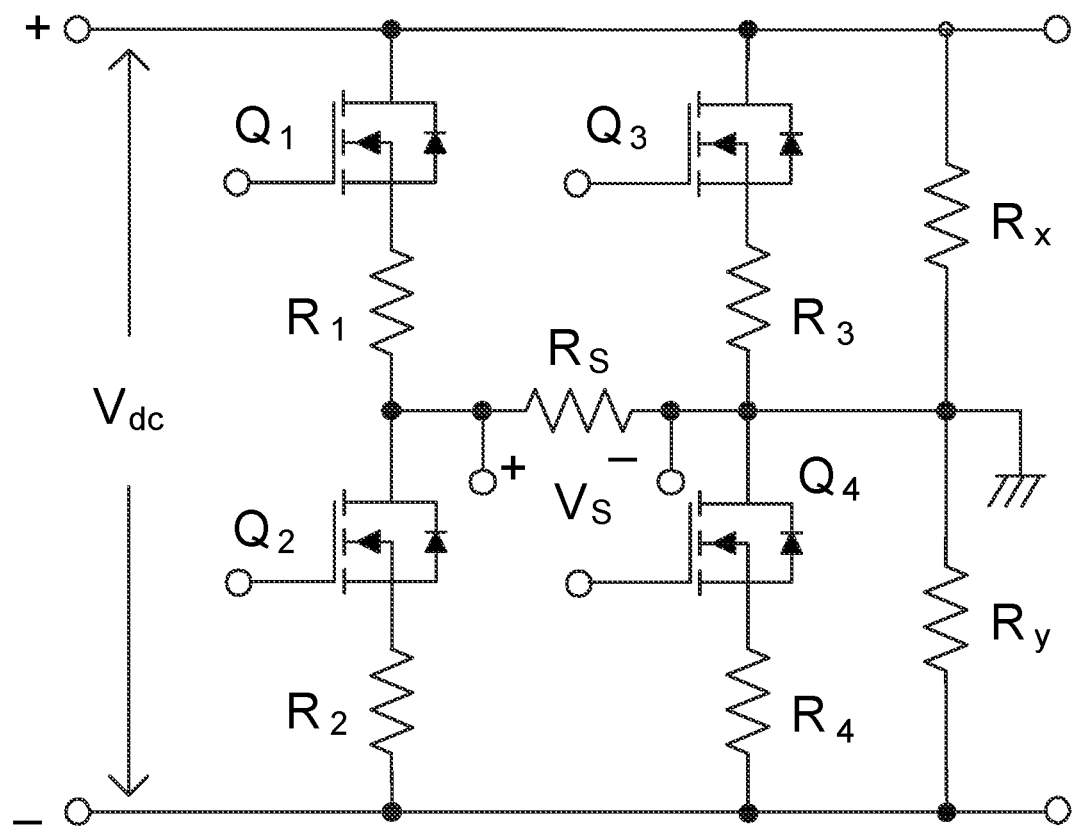
FIG. 1B is a circuit diagram of a second insulation resistance detection circuit in the related art.

Reference will now be made to the drawing figures to describe the present disclosure in detail. It will be understood that the drawing figures and exemplified embodiments of present disclosure are not limited to the details thereof.

Figure 2A:
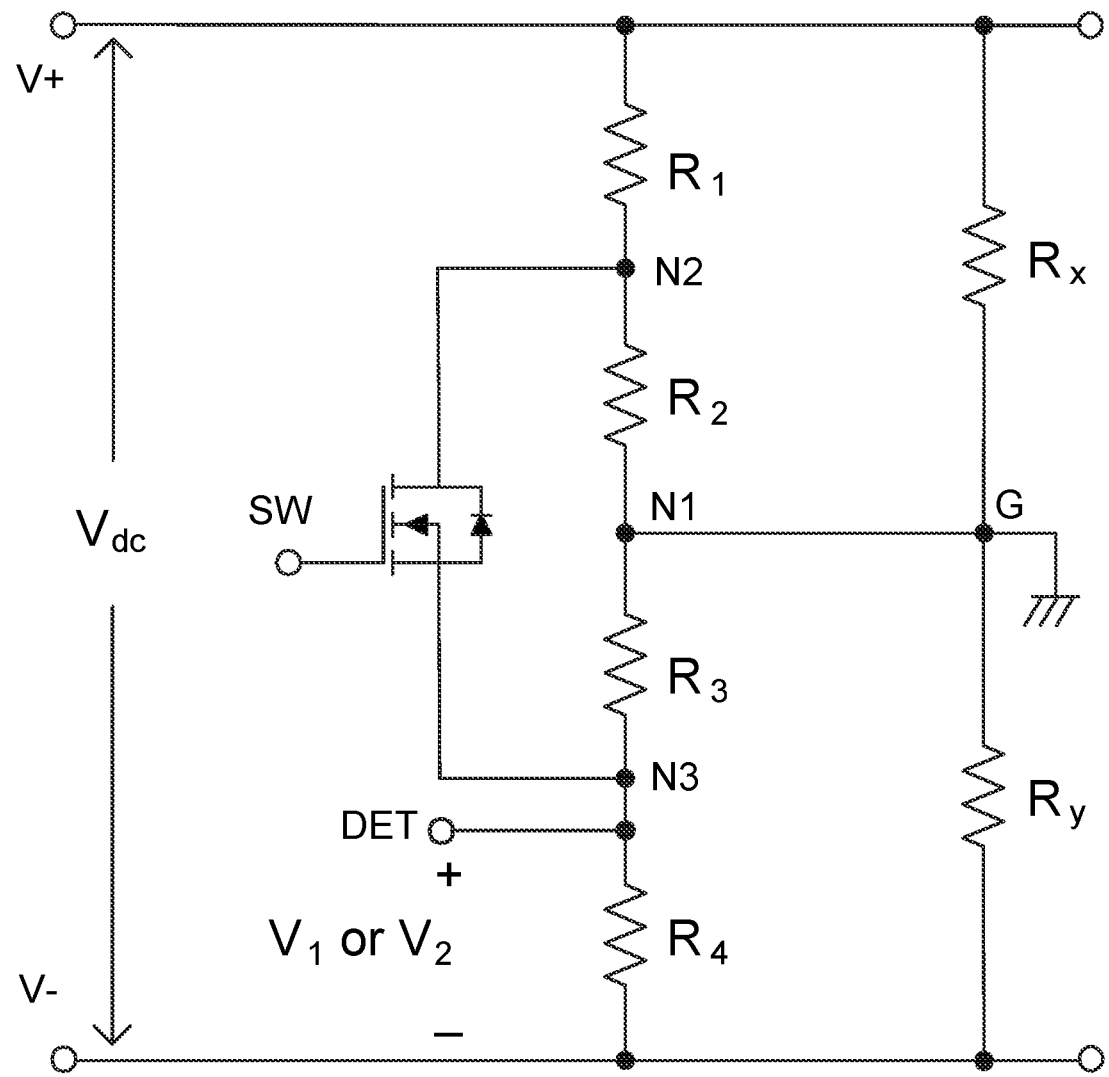
FIG. 2A is a circuit diagram of an insulation resistance detection circuit according to a first embodiment of the present disclosure.
Figure 2B:
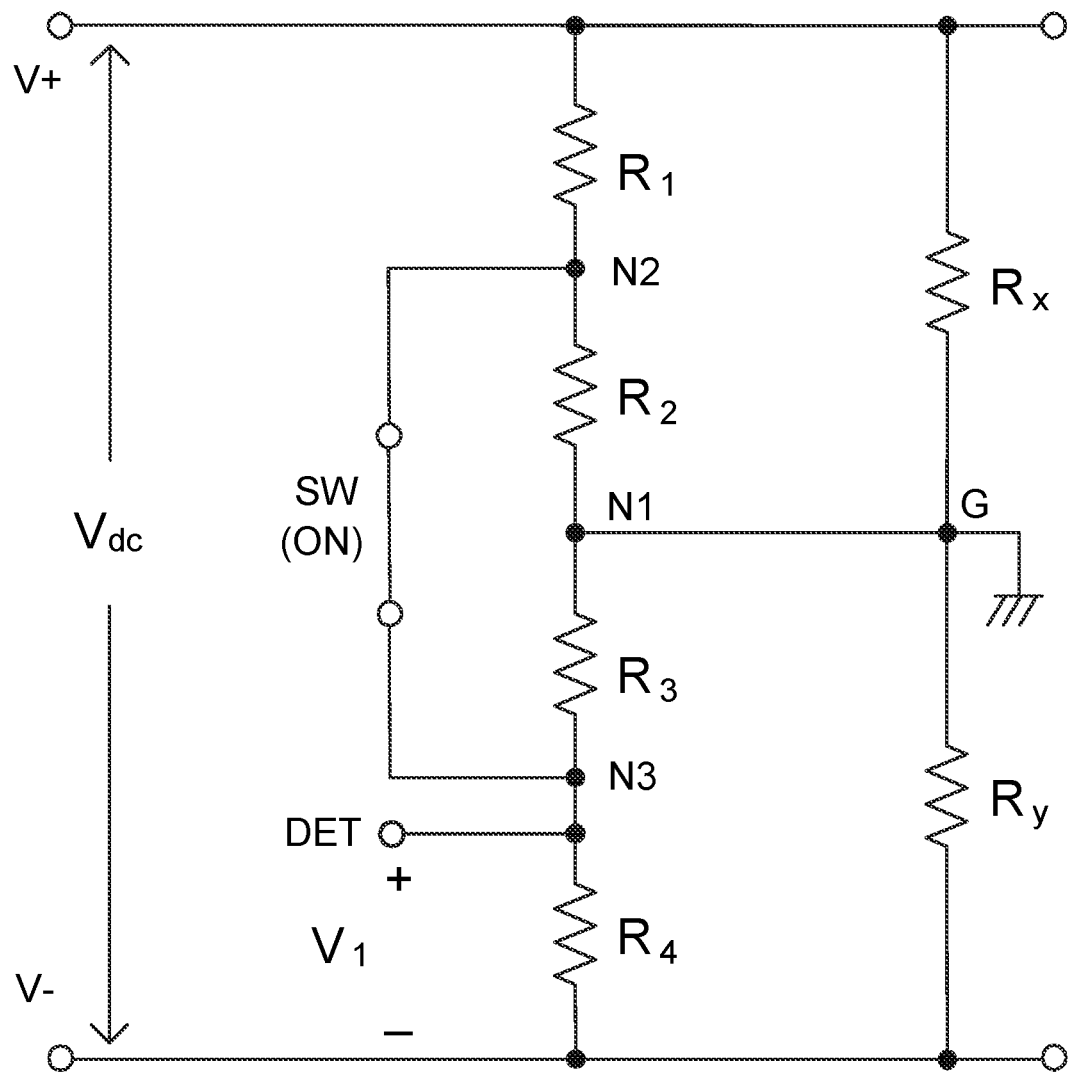
Figure 2C:
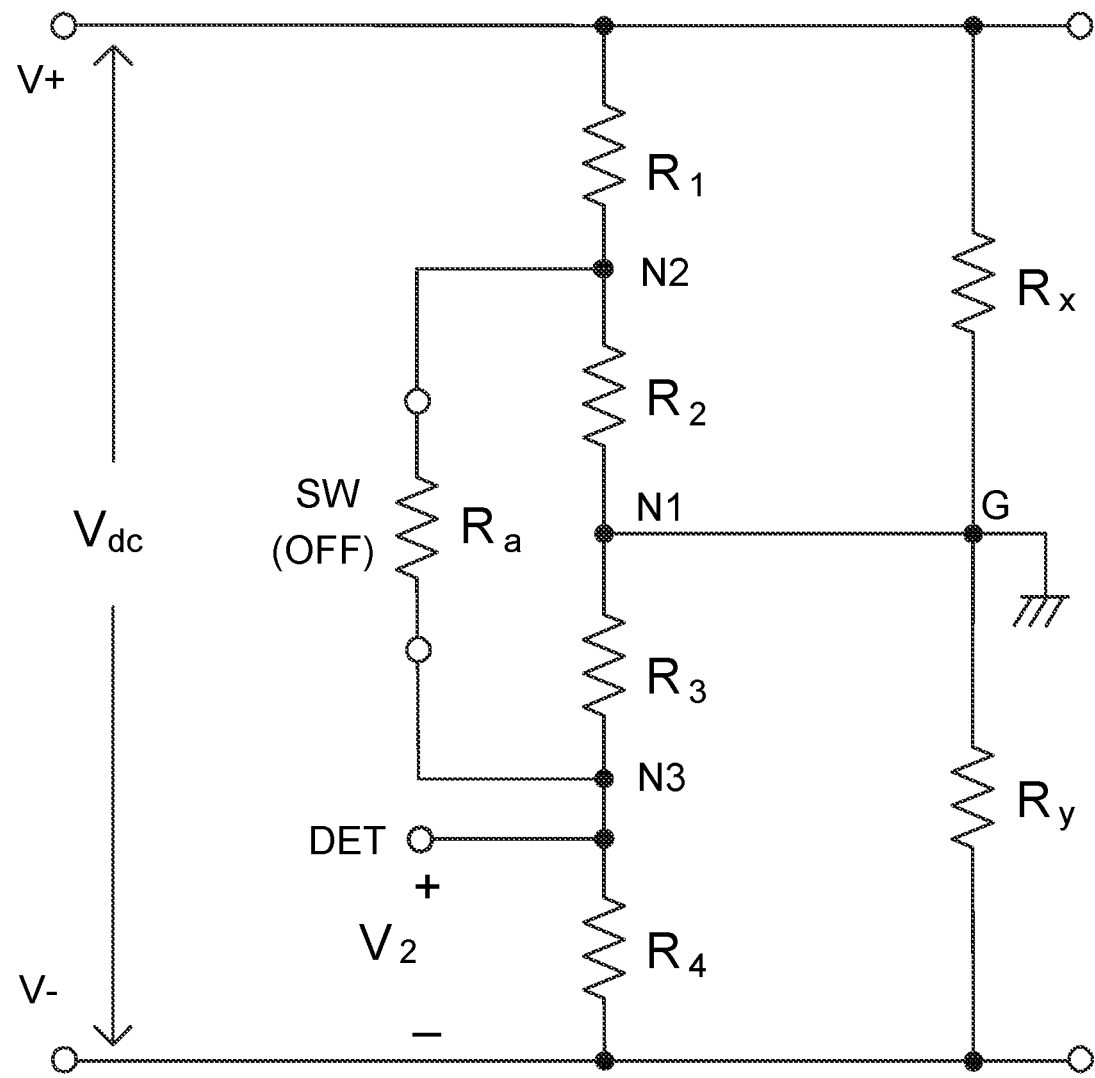
FIG. 2C is a circuit diagram when the switch in FIG. 2A is turned off.

Please refer to FIG. 2A, which shows a circuit diagram of an insulation resistance detection circuit according to a first embodiment of the present disclosure; please refer to FIG. 2B, which shows a circuit diagram when a switch in FIG. 2A is turned on, and please refer to FIG. 2C, which shows a circuit diagram when the switch in FIG. 2A is turned off. As shown in FIG. 2A, the insulation resistance detection circuit is coupled to a positive end V+ and a negative end V− of a DC power source Vdc. The insulation resistance detection circuit is provided to detect a positive insulation resistance Rx between the positive end V+ and a ground point G, and a negative insulation resistance Ry between the negative end V− and the ground point G. The insulation resistance detection circuit includes a first resistance R1, a second resistance R2, a third resistance R3, and a fourth resistance R4 coupled in series, and a switch SW and a detection unit DET. A first node N1 between the second resistance R2 and the third resistance R3 coupled to the ground point G.

The switch SW has a first end and a second end. The first end is coupled to a second node N2 between the first resistance R1 and the second resistance R2. The second node is coupled to a third node N3 between the third resistance R3 and the fourth resistance R4. The detection unit DET is coupled to any two of the positive end V+, the negative end V−, the first node N1, the second node N2, and the third node N3, and only text "DET" is used to indicate that it is a physical detection device.

As shown in FIG. 2A, the detection unit DET is coupled between the third node N3 and the negative end V− for detecting a voltage across two ends of the fourth resistance R4 as a first voltage V1 and a second voltage V2. Specifically, as shown in FIG. 2B, a controller (not shown) is used to turn on the switch SW so that the detection unit DET detects that the voltage across two ends of the fourth resistance R4 is the first voltage V1. As shown in FIG. 2C, the controller turns off the switch SW so that the voltage across two ends of the fourth resistance R4 is the second voltage V2. In practice, when the switch SW is turned off, it is not a complete and ideal open circuit, and therefore the actual effect of the circuit is indicated by a circuit resistance Ra.

Moreover, the detection unit DET sets a first estimated resistance of the positive insulation resistance and a second estimated resistance of the negative insulation resistance, and therefore the detection unit DET calculates a third voltage and a fourth voltage according to the first estimated resistance and the second estimated resistance so as to detect the positive insulation resistance Rx and the negative insulation resistance Ry when the third voltage is equal to the first voltage V1 and the fourth voltage is equal to the second voltage V2. In one embodiment, the detection unit DET may be a microcontroller (MCU) or a microcontroller (MCU) with a voltage/current sensor. The methods for voltage calculation/estimation and resistance tracking can mainly be implemented by microcontrollers, but other types of controllers, such as but not limited to other components/circuits with computing/processing functions such as microprocessors (MPUs) and digital controllers (DSPs).

Figure 9:
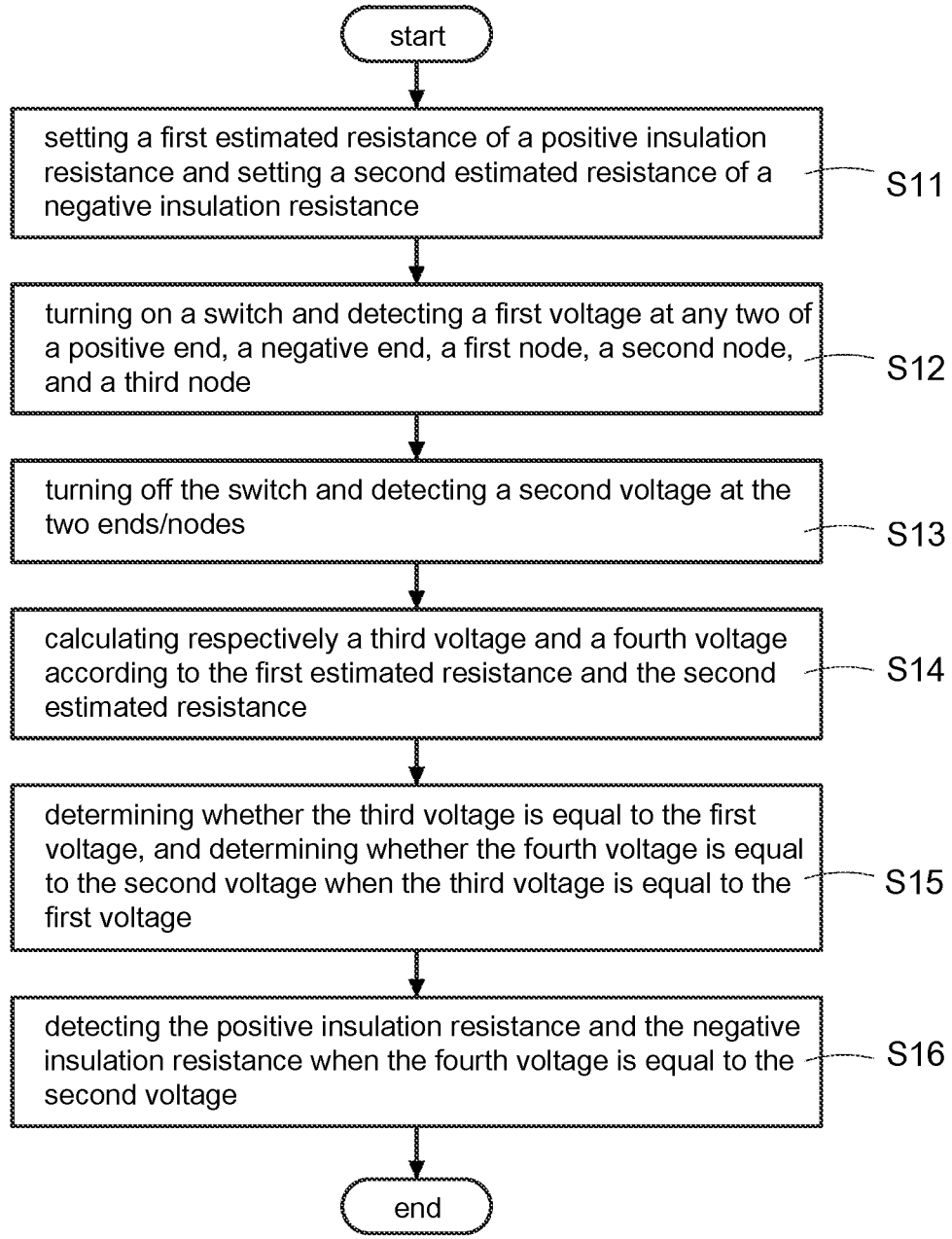
FIG. 9 is a flowchart of a method of detecting insulation resistance according to the present disclosure.
Figure 10:
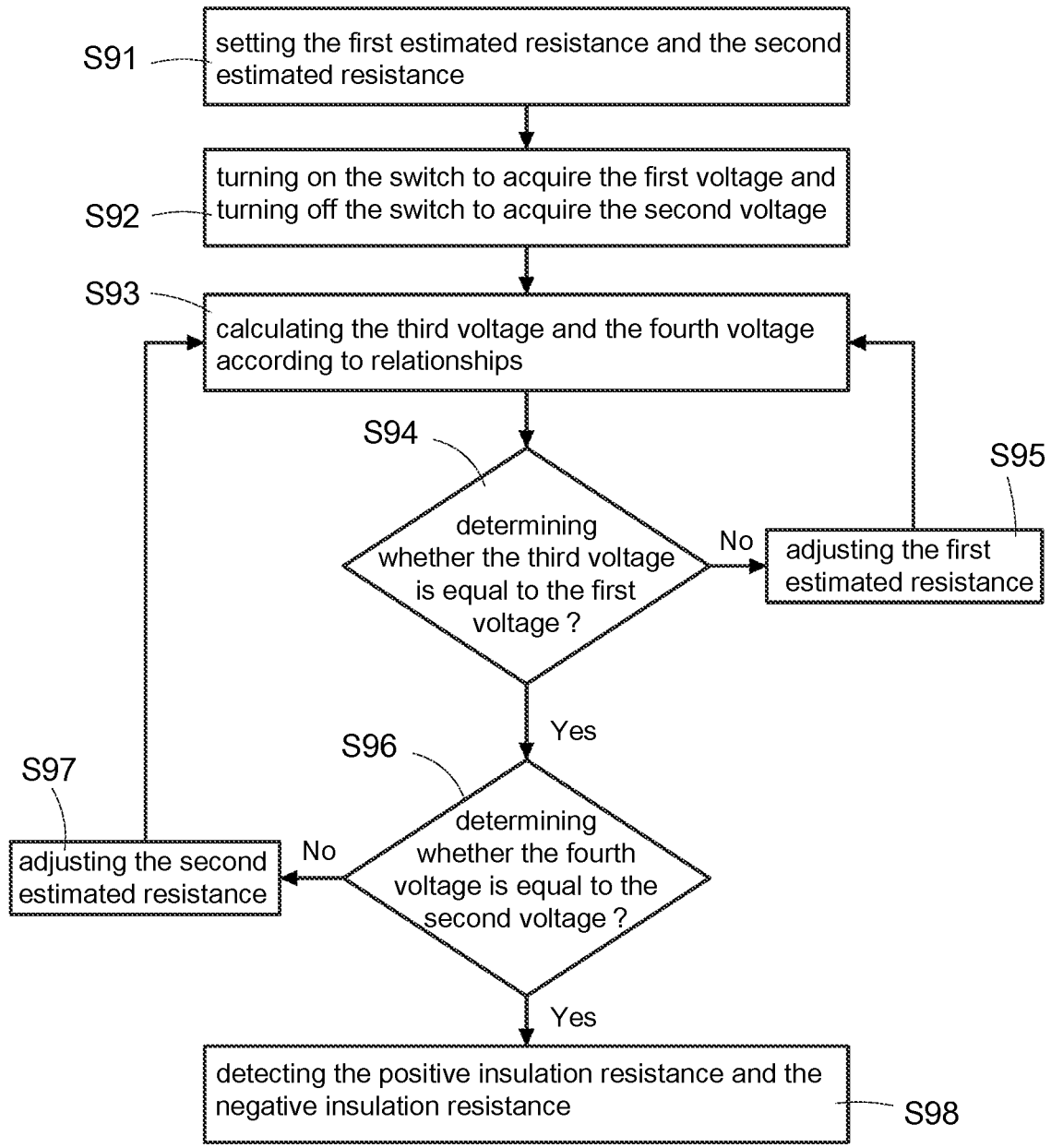
FIG. 10 is a detailed flowchart of the method of detecting insulation resistance according to the present disclosure.

Please refer to FIG. 9 and FIG. 10, which respectively show a flowchart and a detailed flowchart of a method of detecting insulation resistance according to the present disclosure. As shown in FIG. 9, the method of detecting insulation resistance includes steps of: setting a first estimated resistance of the positive insulation resistance and setting a second estimated resistance of the negative insulation resistance (S11). Before performing the insulation resistance detection, the estimated resistances are set as initial values of the recursive operation, this step corresponds to the step (S91) of FIG. 10. Afterward, turning on a switch and detecting a first voltage at any two of the positive end, the negative end, the first node, the second node, and the third node (S12). As mentioned above, the switch is controlled to be turned on by a controller so that the voltage between any two ends/nodes is the first voltage.

Afterward, turning off the switch and detecting a second voltage at the two ends/nodes (S13). The controller is used to turn off the switch so that the voltage between any two ends/nodes is the second voltage. In particular, the step (S12) is not limited to be performed before step (S13), that is, in step (S13), the switch is turned off to detect the second voltage, and then in step (S12), the switch is turned on to detect the first voltage. In particular, the step (S12) and step (S13) shown in FIG. 9 correspond to step (S92) of FIG. 10. In particular, the step (S91) is not limited to be performed before step (S92), that is, step (S92) may be performed first to detect the first voltage and the second voltage, and then step (S91) is performed to set the initial estimated resistances.

Afterward, calculating respectively a third voltage and a fourth voltage according to the first estimated resistance and the second estimated resistance (S14), that is, corresponding to step (S93) of FIG. 10. Take the first embodiment of FIG. 2A as an example, when the switch SW is turned on, the resistance network shown in FIG. 2B can be integrated into an equivalent resistance network. Therefore, the third voltage (i.e., the calculated first voltage) can be calculated by relationship (1-1) according to the known first resistance R1, the second resistance R2, the third resistance R3, the fourth resistance R4, and the positive insulation resistance Rx (which is the preset first estimated resistance), the negative insulation resistance Ry (which is the preset second estimated resistance), and the DC power source Vdc, that is:

$$V_1 = V_{dc} \times \frac{(R_{y2//3}//R_4)}{(R_{x2//3}//R_1) + (R_{y2//3}//R_4)} \qquad \text{relationship (1-1)}$$

In which, Rx2/3 is an equivalent resistance related to the second resistance R2, the third resistance R3, and the first estimated resistance, and Ry2/3 is an equivalent resistance related to the second resistance R2, the third resistance R3, and the second estimated resistance. Therefore, the calculated first voltage, i.e., the third voltage can be calculated by relationship (1-1).

Similarly, when the switch SW is turned off, the resistance network shown in FIG. 2C can be integrated into an equivalent resistance network. Therefore, the fourth voltage (i.e., the calculated second voltage) can be calculated by relationship (1-2) according to the known first resistance R1, the second resistance R2, the third resistance R3, the fourth resistance R4, and the positive insulation resistance Rx (which is the preset first estimated resistance), the negative insulation resistance Ry (which is the preset second estimated resistance), and the DC power source Vdc, that is:

$$V_2 = V_{dc} \times \frac{((R_4 + R_{3a})//R_{y23})}{((R_4 + R_{3a})//R_{y23}) + ((R_1 + R_{2a})//R_{x23})} \times \frac{R_4}{R_4 + R_{3a}} \qquad \text{relationship (1-2)}$$

In which, R2a is an equivalent resistance related to the second resistance R2 and the circuit resistance Ra, R3a is an equivalent resistance related to the third resistance R3 and the circuit resistance Ra, Rx23 is an equivalent resistance related to the second resistance R2, the third resistance R3, and the first estimated resistance, Ry23 is an equivalent resistance related to the second resistance R2, the third resistance R3, and the second estimated resistance. Therefore, the calculated second voltage, i.e., the fourth voltage can be calculated by relationship (1-2).

Afterward, determining whether the third voltage is equal to the first voltage, and determining whether the fourth voltage is equal to the second voltage when the third voltage is equal to the first voltage (S15), and detecting the positive insulation resistance and the negative insulation resistance when the fourth voltage is equal to the second voltage (S16), which can be implemented in steps (S94)-(S98) of FIG. 10. In step (S94), determining whether the third voltage (i.e., that first voltage calculated by relationship (1-1)) is equal to the first voltage detected/measured in step (S12), that is, determining whether the calculated first voltage is equal to (matches) the actual detected/measured first voltage. If the two voltages are different, adjusting the first estimated resistance (S95). For example, it is assumed that the first estimated resistance is initially set to 10 MΩ. If the calculated first voltage is not equal to the actual measured first voltage, the first estimated resistance is decreased, for example, but not limited to 1 kΩ. Therefore, step (S93) is performed again to calculate the (new) first voltage, that is, the third voltage. Afterward, determining whether the third voltage is equal to the first voltage (S94) again. If the two voltages are still different, the first estimated resistance is decreased again until the third voltage is equal to the first voltage.

Afterward, in step (S96), determining whether the fourth voltage (i.e., that second voltage calculated by relationship (1-2)) is equal to the second voltage detected/measured in step (S13), that is, determining whether the calculated second voltage is equal to (matches) the actual detected/measured second voltage. If the two voltages are different, adjusting the second estimated resistance (S97). For example, it is assumed that the second estimated resistance is initially set to 10 MΩ. If the calculated second voltage is not equal to the actual measured second voltage, the second estimated resistance is decreased, for example, but not limited to 1 kΩ. Therefore, step (S93) is performed again to calculate the (new) second voltage, that is, the fourth voltage. Afterward, determining whether the fourth voltage is equal to the second voltage (S96) again. If the two voltages are still different, the second estimated resistance is decreased again until the fourth voltage is equal to the second voltage.

Therefore, when the third voltage is equal to the first voltage and the fourth voltage is equal to the second voltage, the positive insulation resistance and the negative insulation resistance can be detected (S98). In other words, when the third voltage is equal to the first voltage and the fourth voltage is equal to the second voltage, the adjusted first estimated resistance (for example, being adjusted from 10 MΩ to 9.85 MΩ) is the accurate positive insulation resistance (9.85 MΩ). Similarly, the adjusted second estimated resistance (for example, being adjusted from 10 MΩ to 9.85 MΩ) is the accurate negative insulation resistance (9.85 MΩ). In particular, the step (S94) is not limited to be performed before step (S96), that is, step (S96) may be performed first to determinate the fourth voltage and the second voltage, and then step (S94) is performed to determinate the third voltage and the first voltage, it can also achieve accurate detection of positive insulation resistance and negative insulation resistance.

Figure 3A:
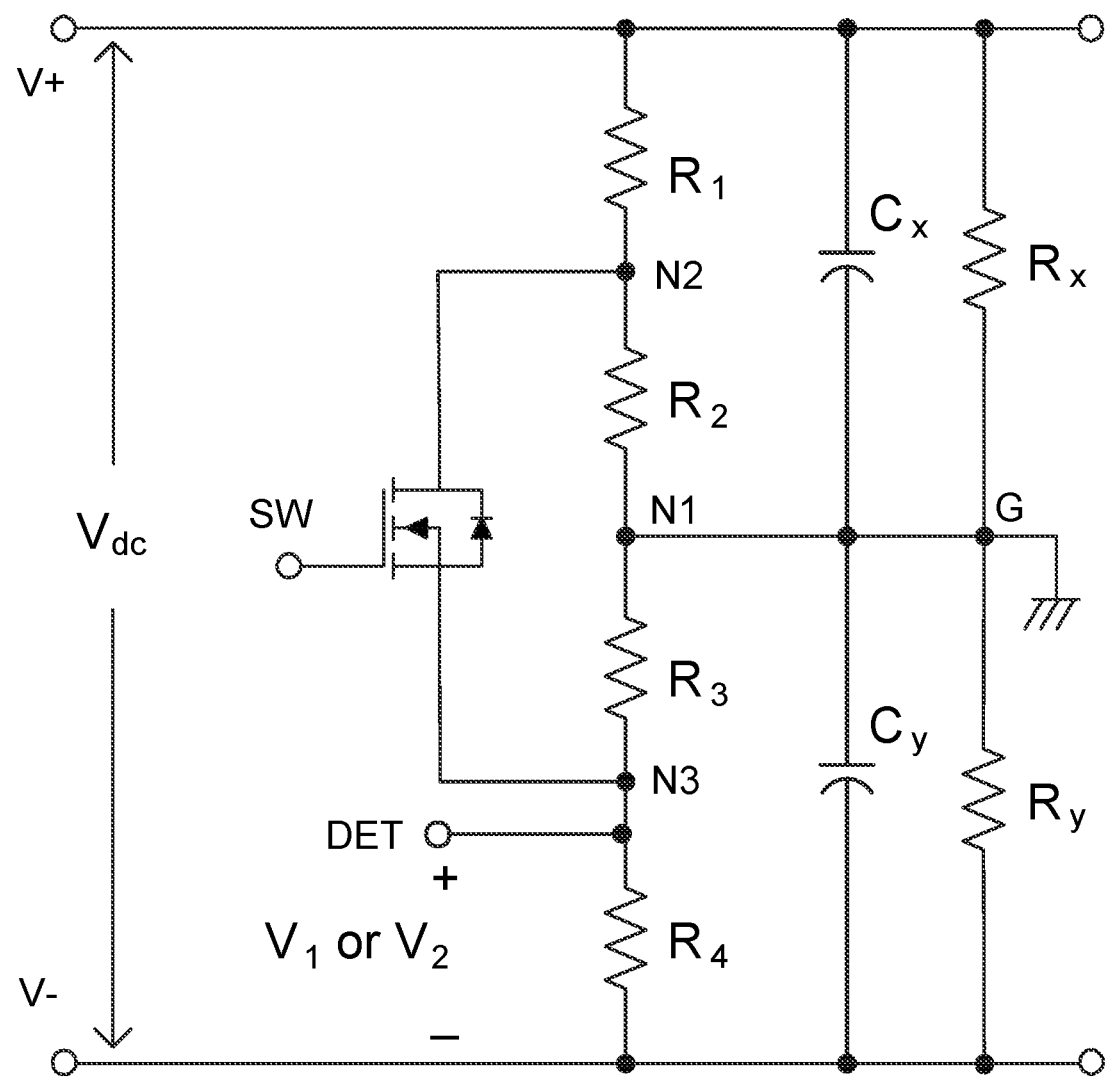
FIG. 3A is a circuit diagram of the insulation resistance detection circuit according to a second embodiment of the present disclosure.
Figure 3B:
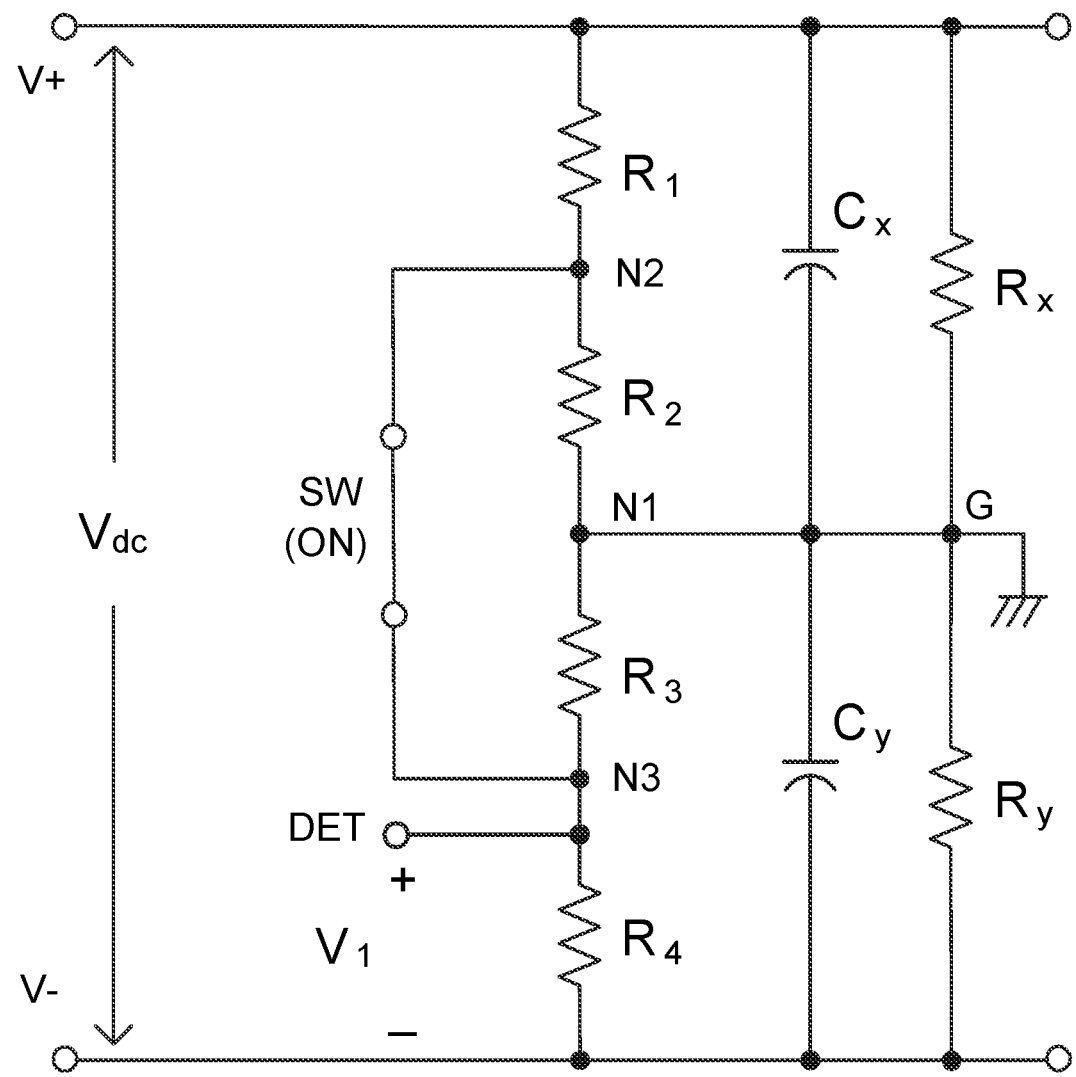
Figure 3C:
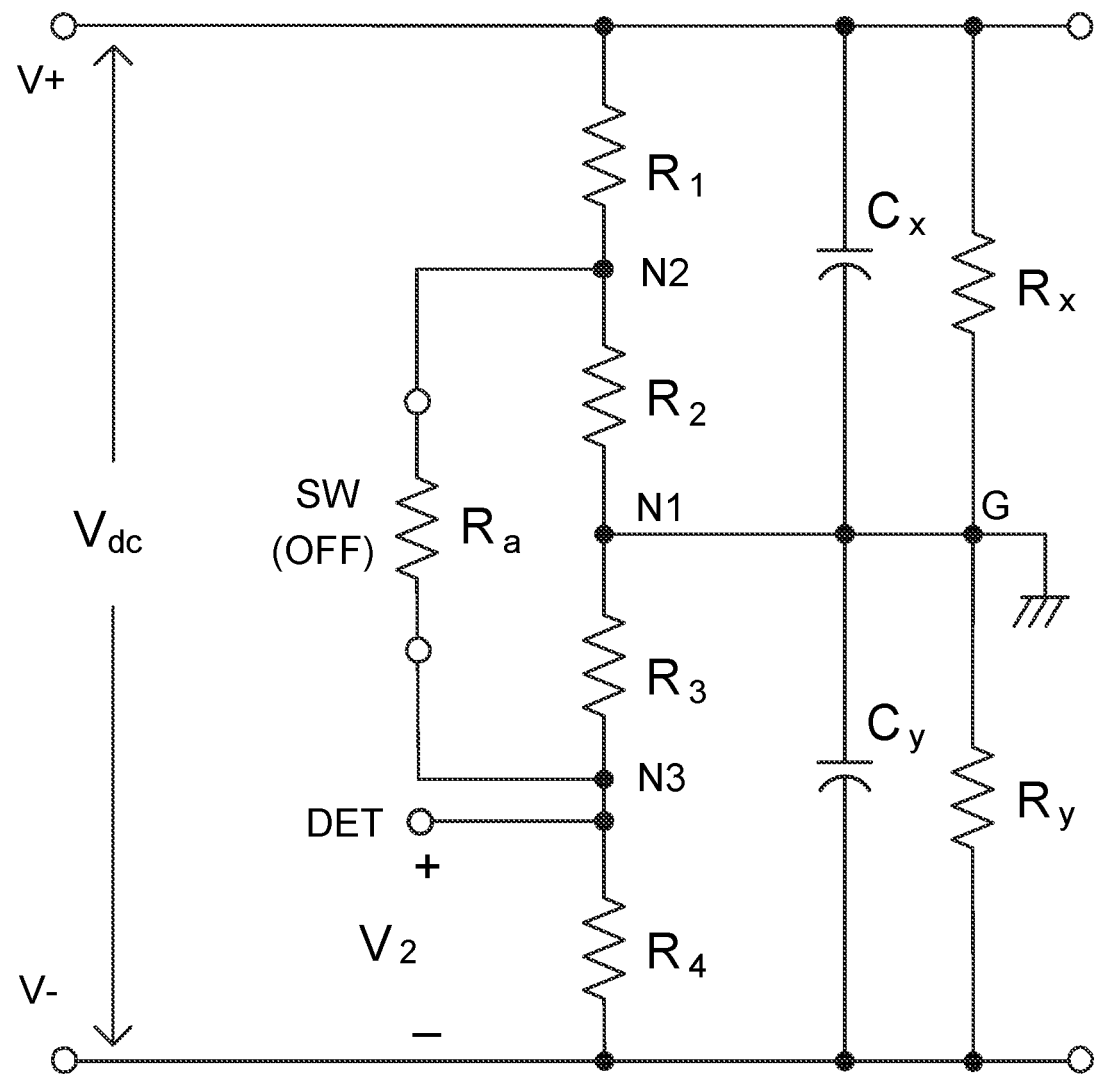
FIG. 3C is a circuit diagram when the switch in FIG. 3A is turned off.
Figure 4A:
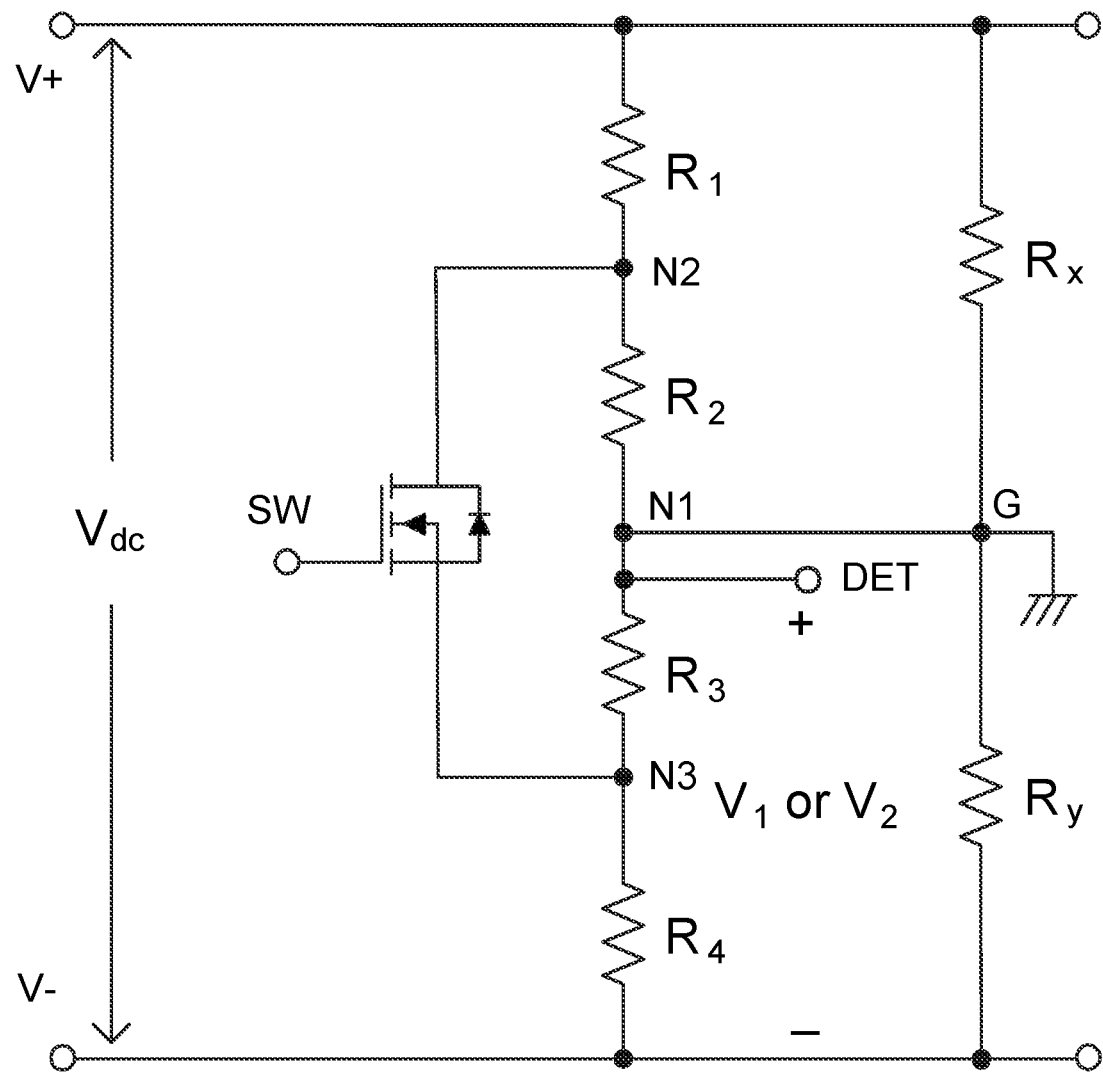
FIG. 4A is a circuit diagram of the insulation resistance detection circuit according to a third embodiment of the present disclosure.
Figure 4B:
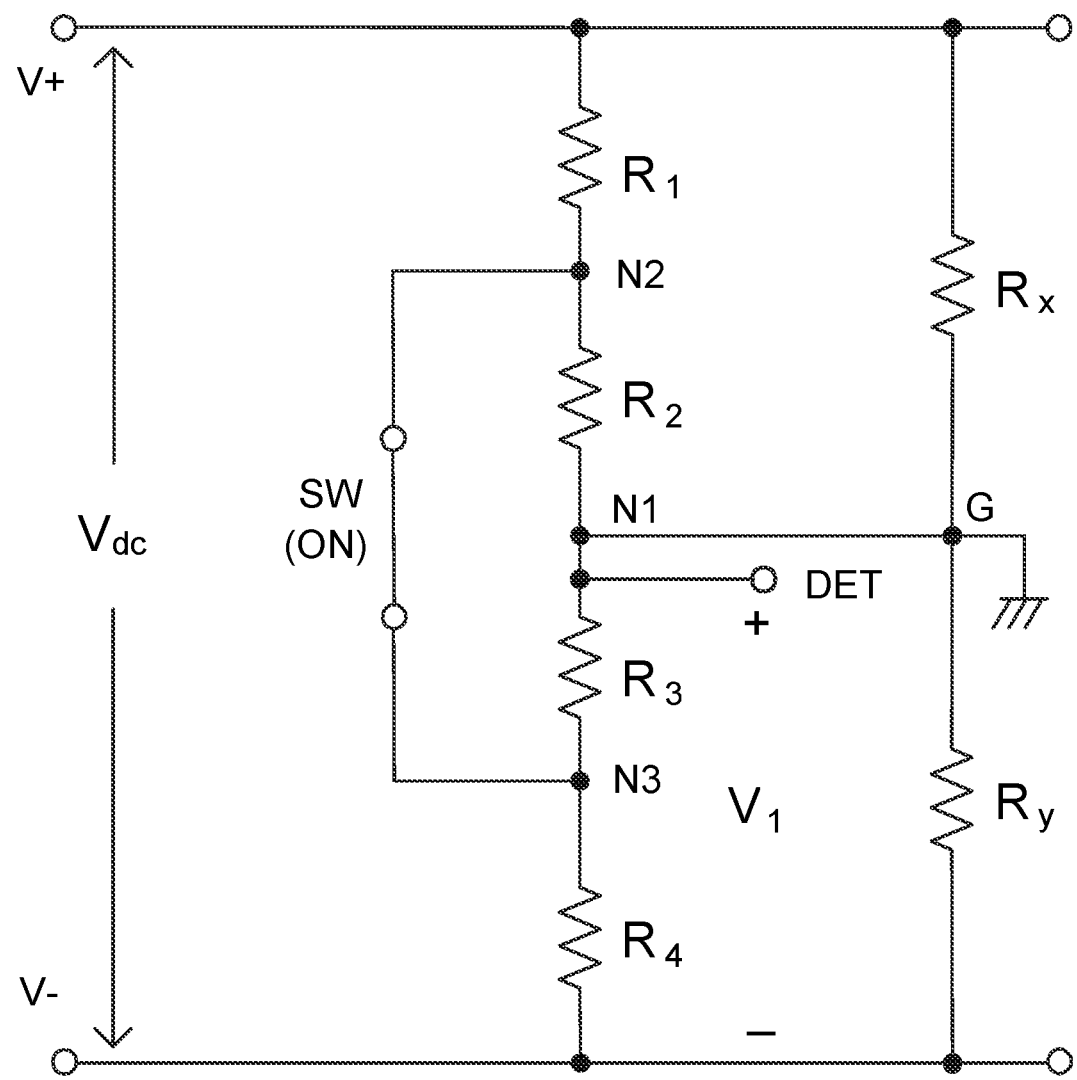
Figure 4C:
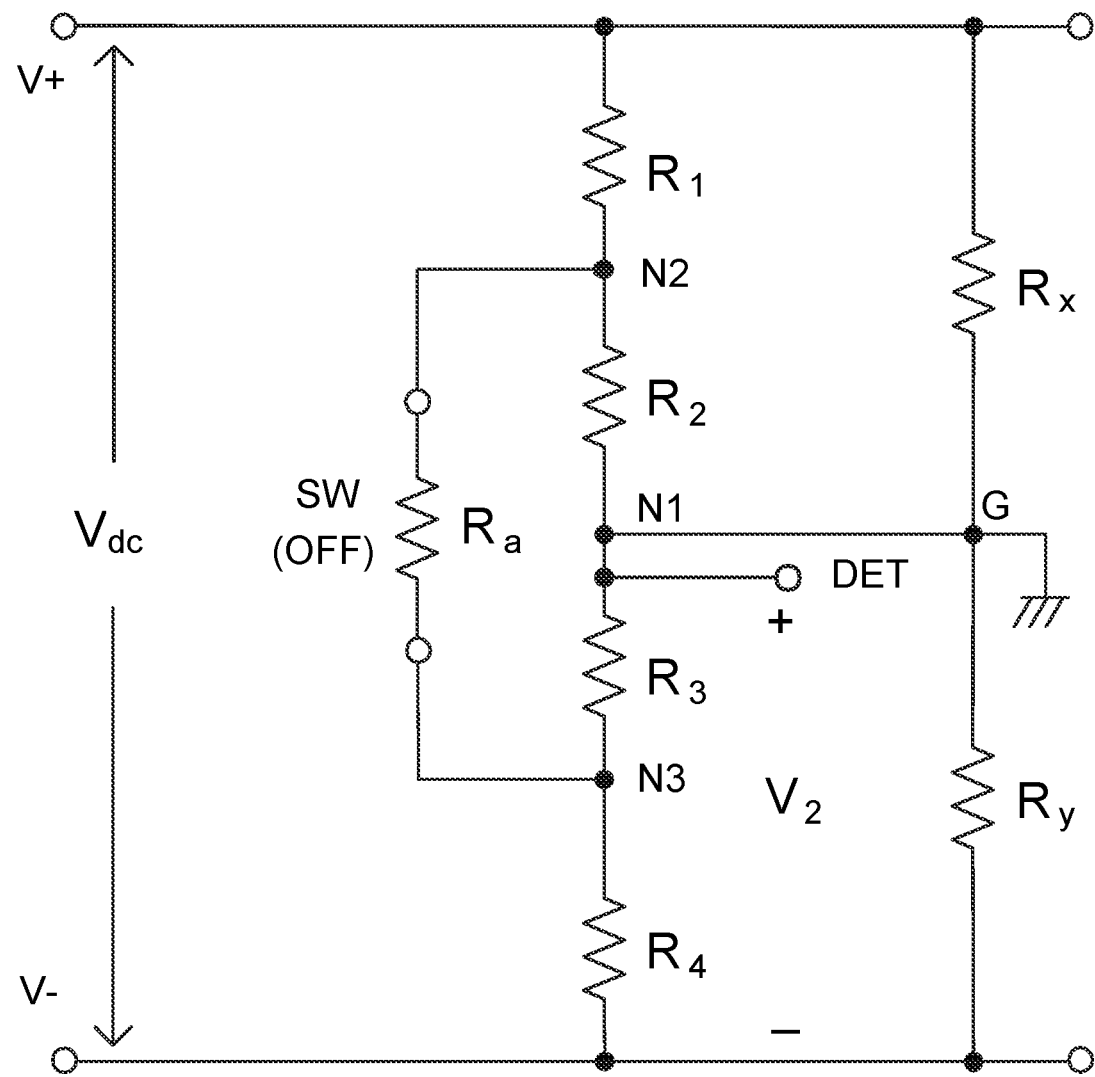
FIG. 4C is a circuit diagram when the switch in FIG. 4A is turned off.
Figure 5A:
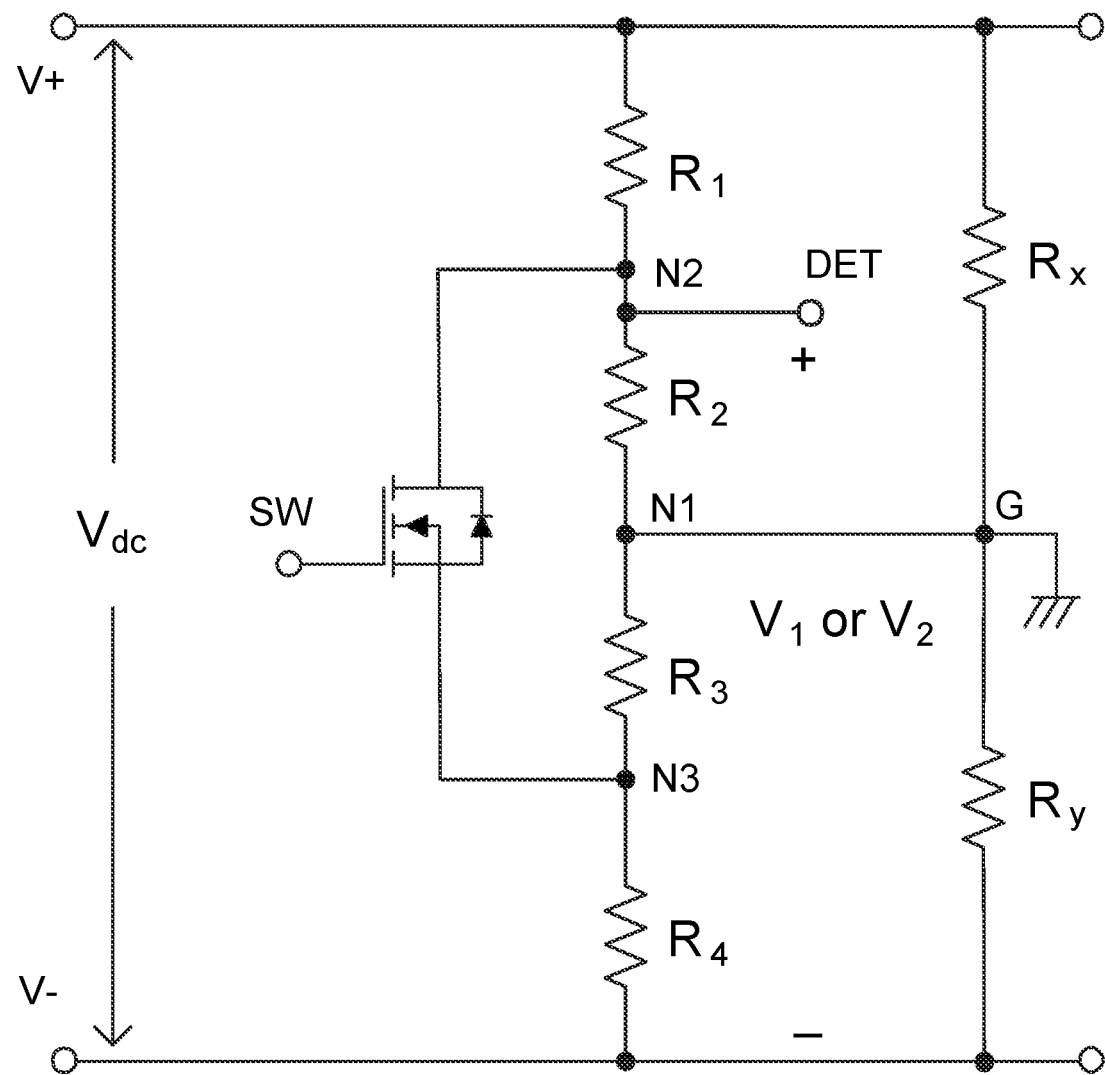
FIG. 5A is a circuit diagram of the insulation resistance detection circuit according to a fourth embodiment of the present disclosure.
Figure 5B:
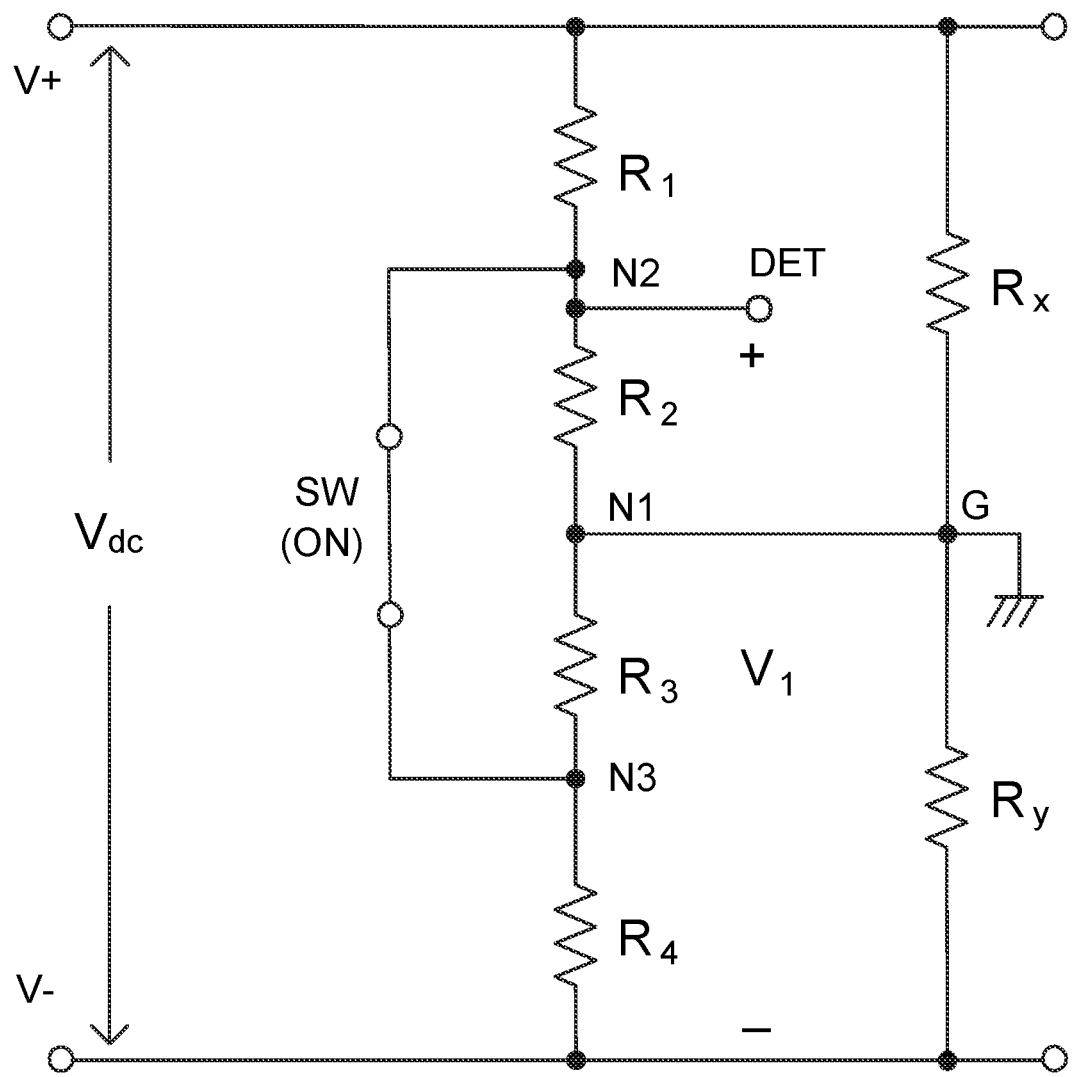
Figure 5C:
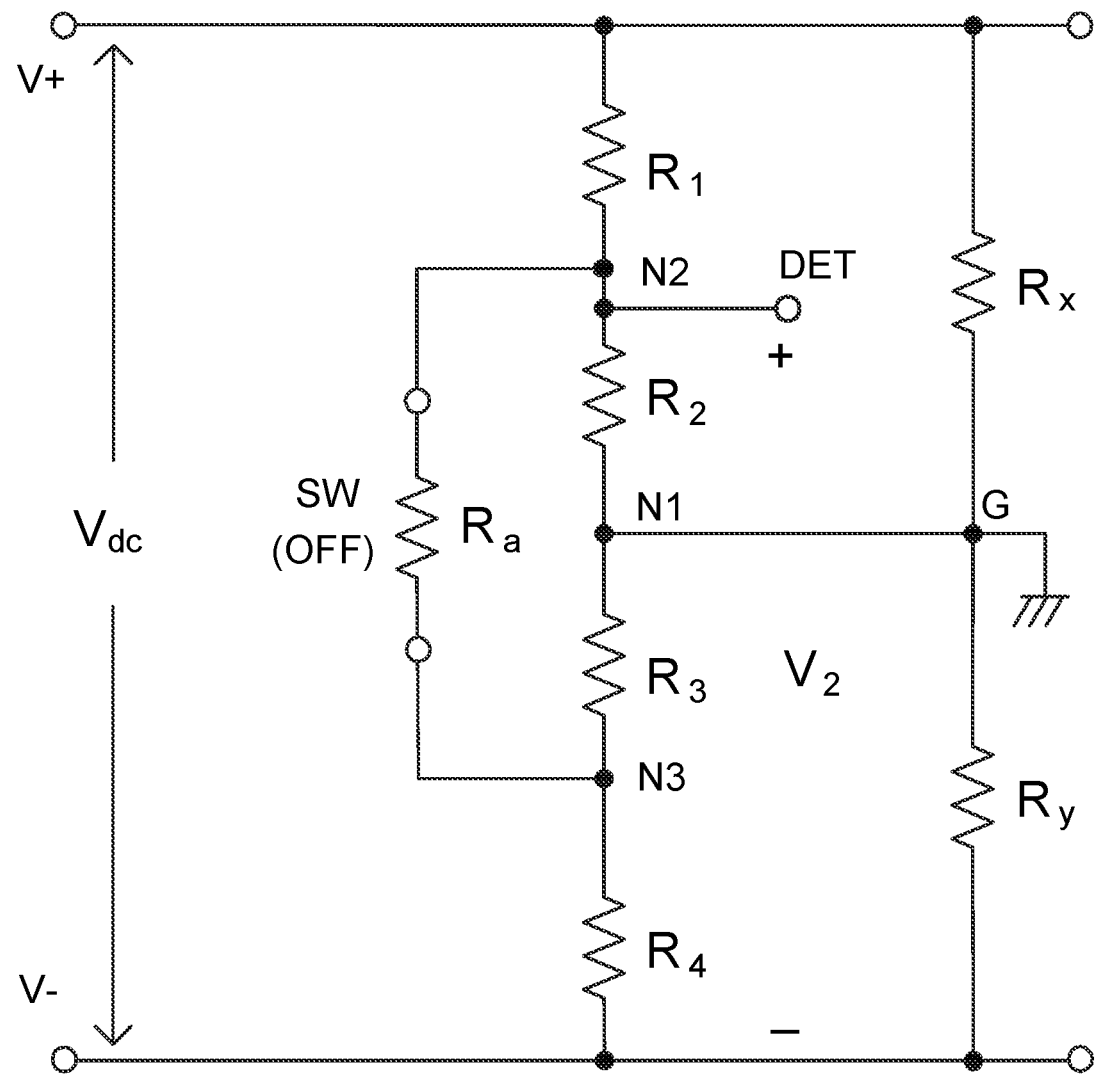
FIG. 5C is a circuit diagram when the switch in FIG. 5A is turned off.
Figure 6A:
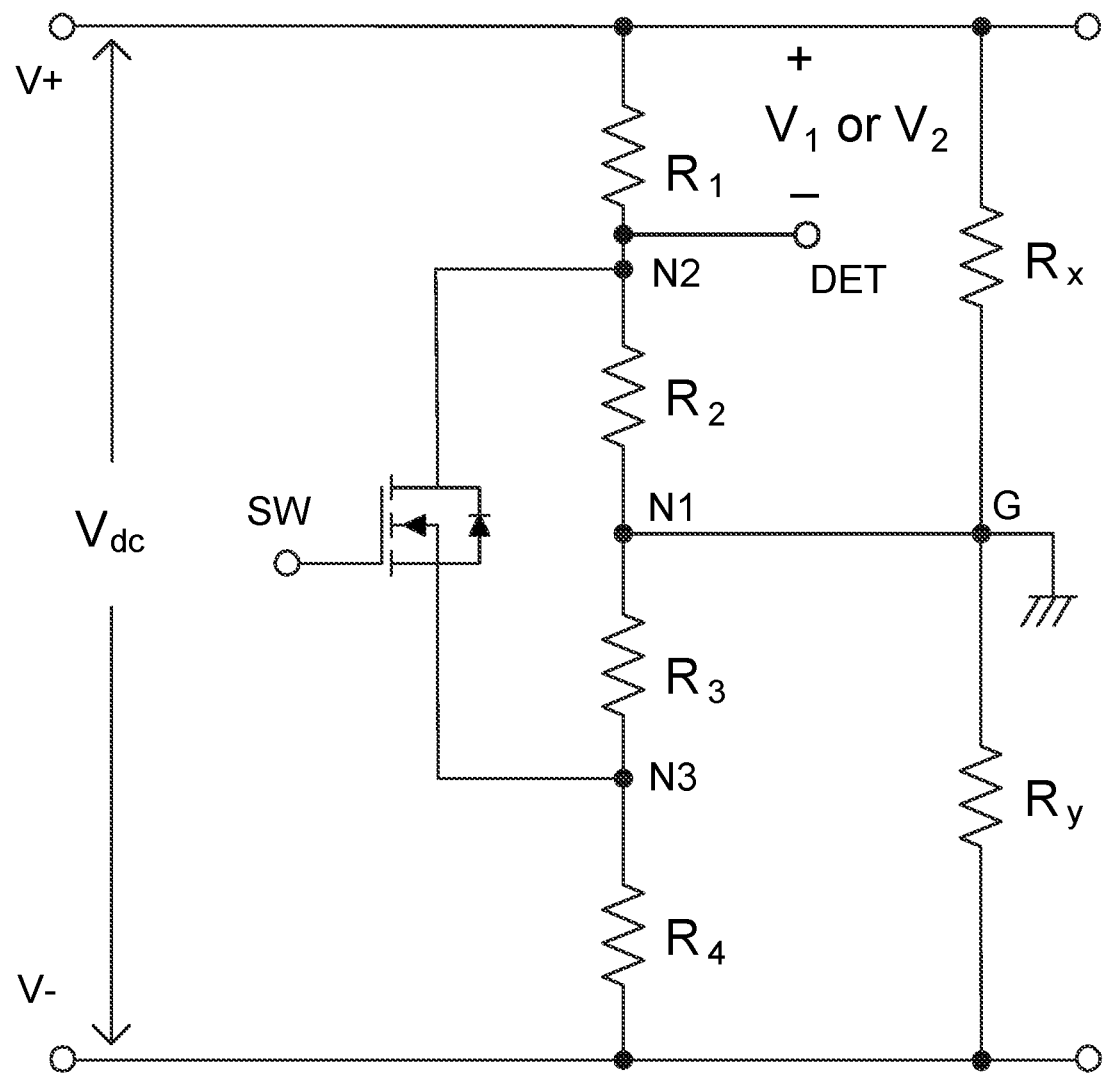
FIG. 6A is a circuit diagram of the insulation resistance detection circuit according to a fifth embodiment of the present disclosure.
Figure 6B:
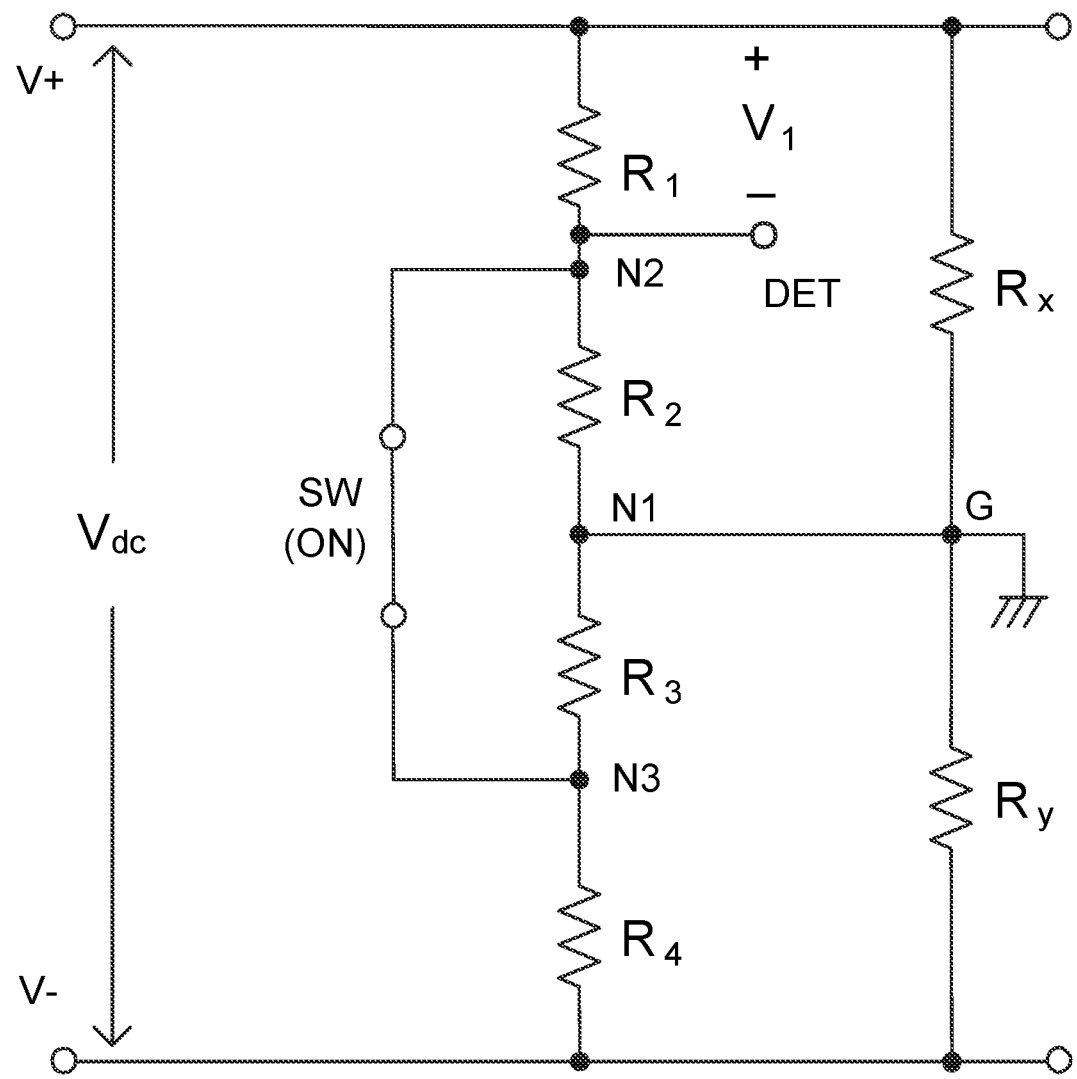
Figure 6C:
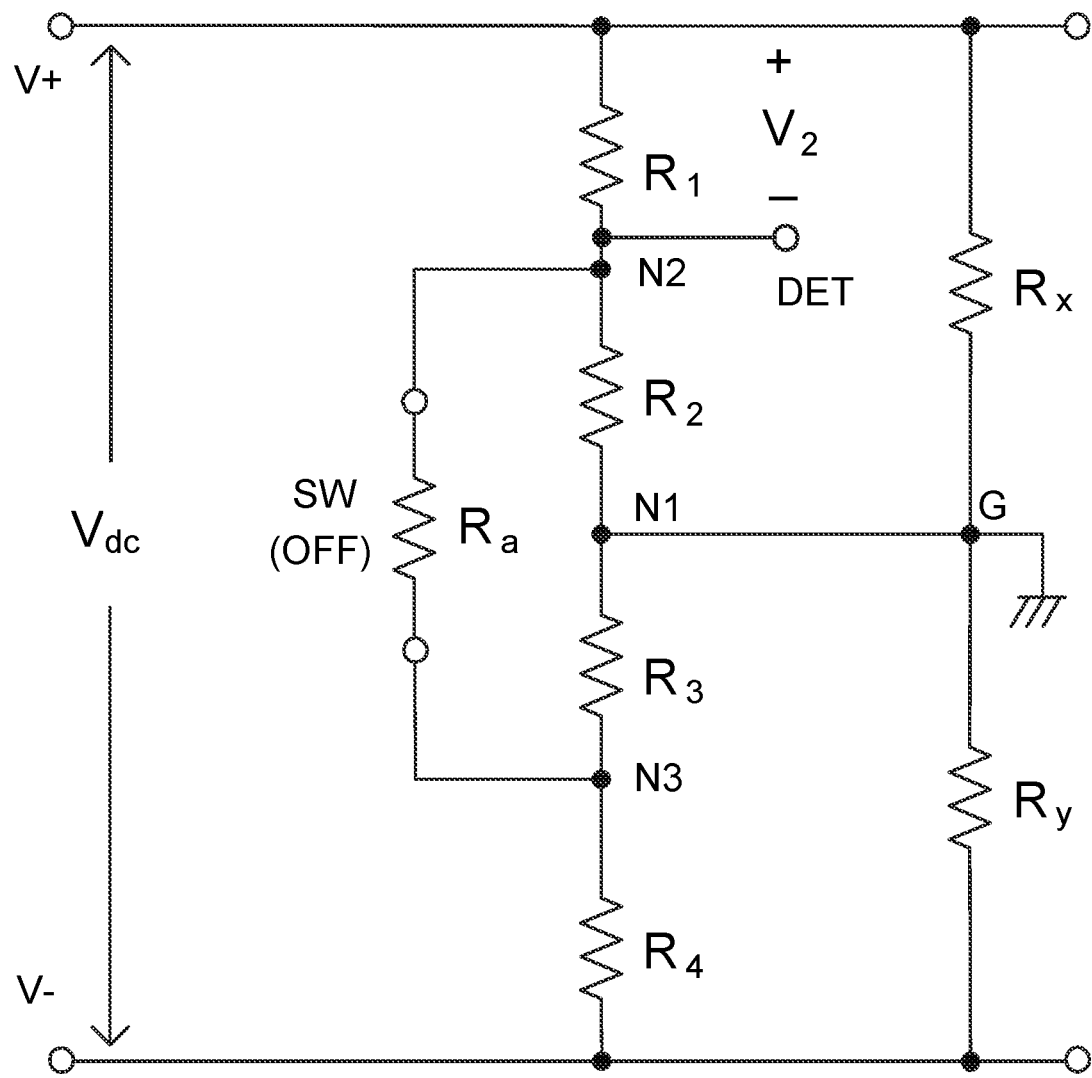
FIG. 6C is a circuit diagram when the switch in FIG. 6A is turned off.
Figure 7A:
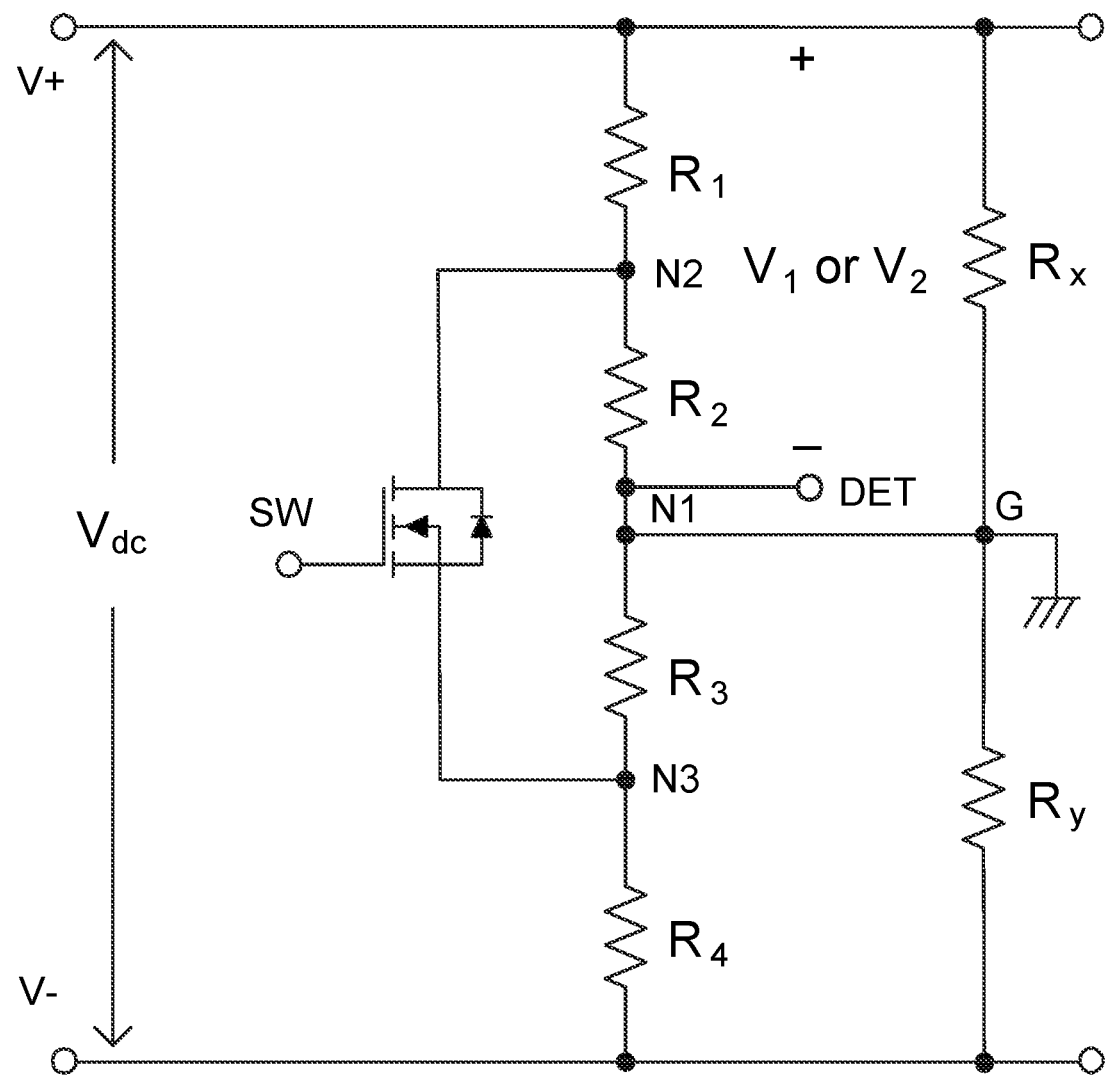
FIG. 7A is a circuit diagram of the insulation resistance detection circuit according to a sixth embodiment of the present disclosure.
Figure 7B:
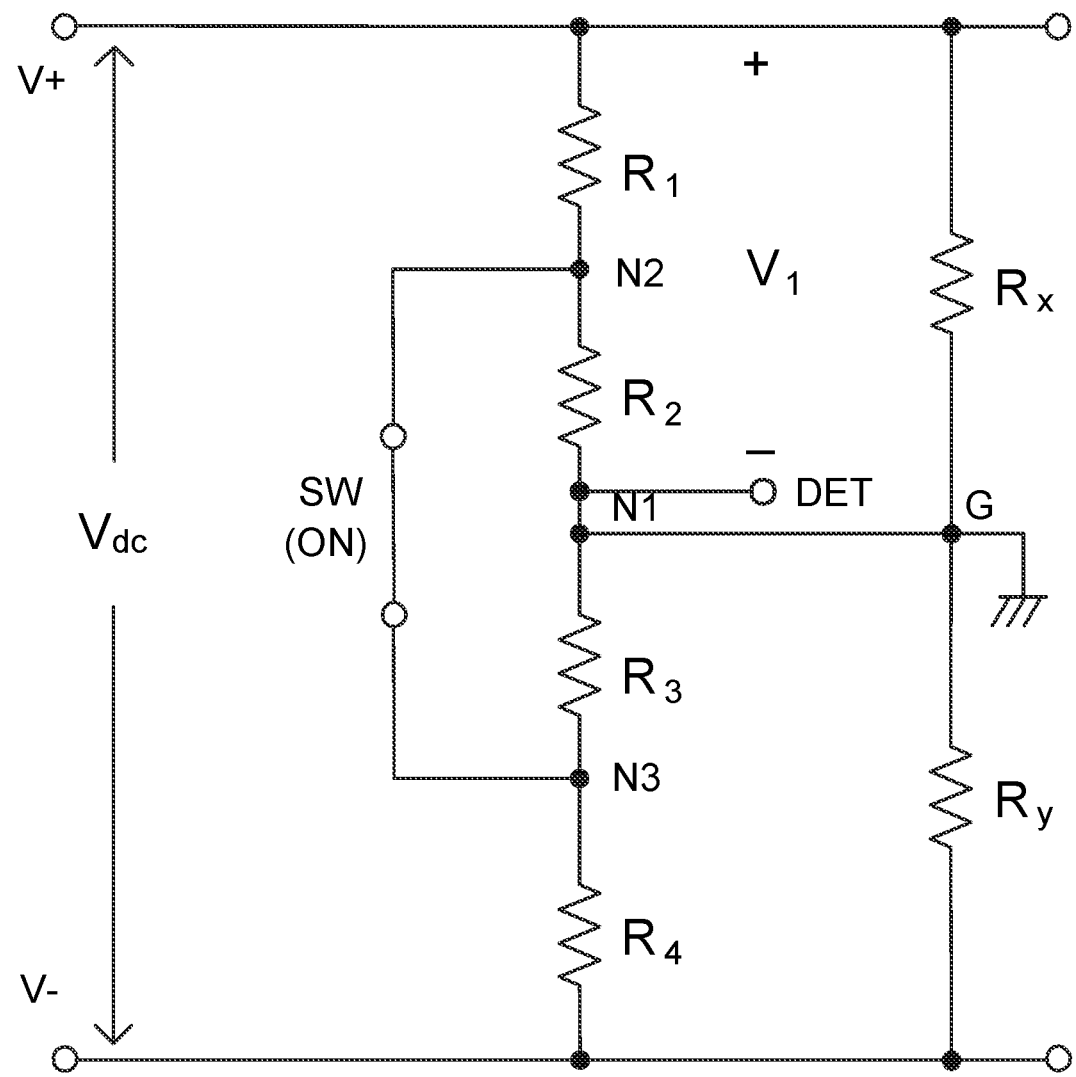
Figure 7C:
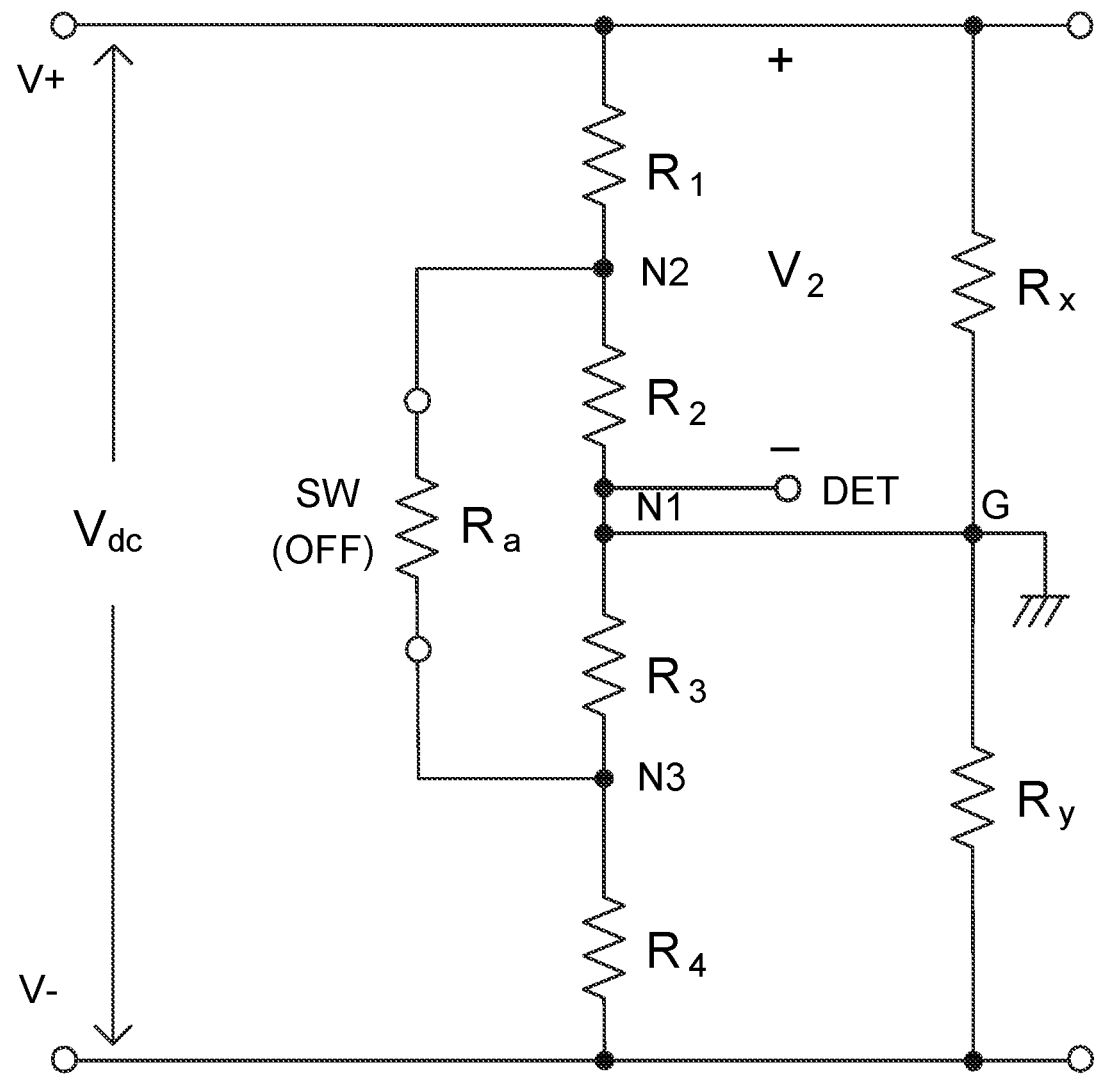
FIG. 7C is a circuit diagram when the switch in FIG. 7A is turned off.
Figure 8A:
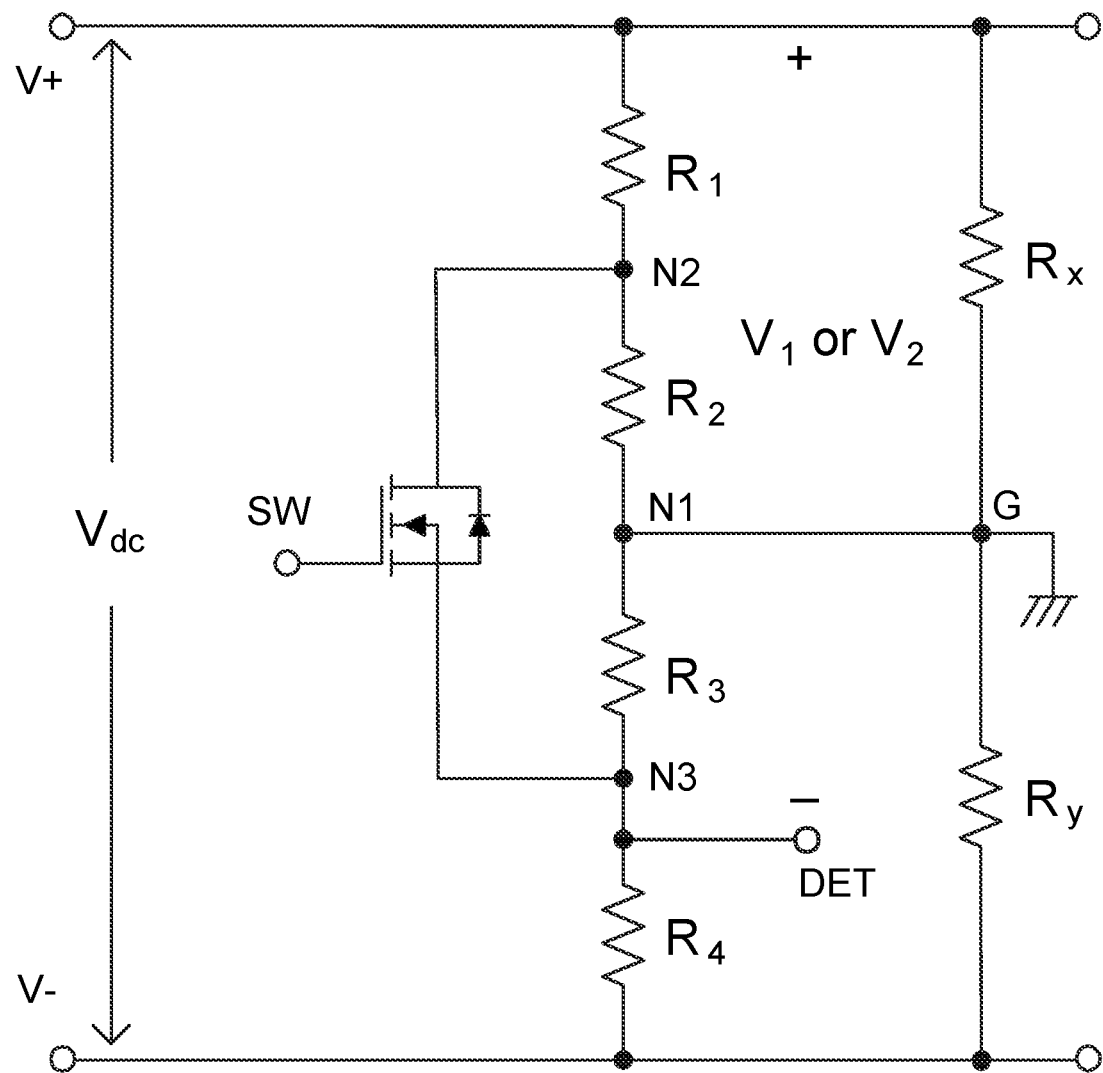
FIG. 8A is a circuit diagram of the insulation resistance detection circuit according to a seventh embodiment of the present disclosure.
Figure 8B:
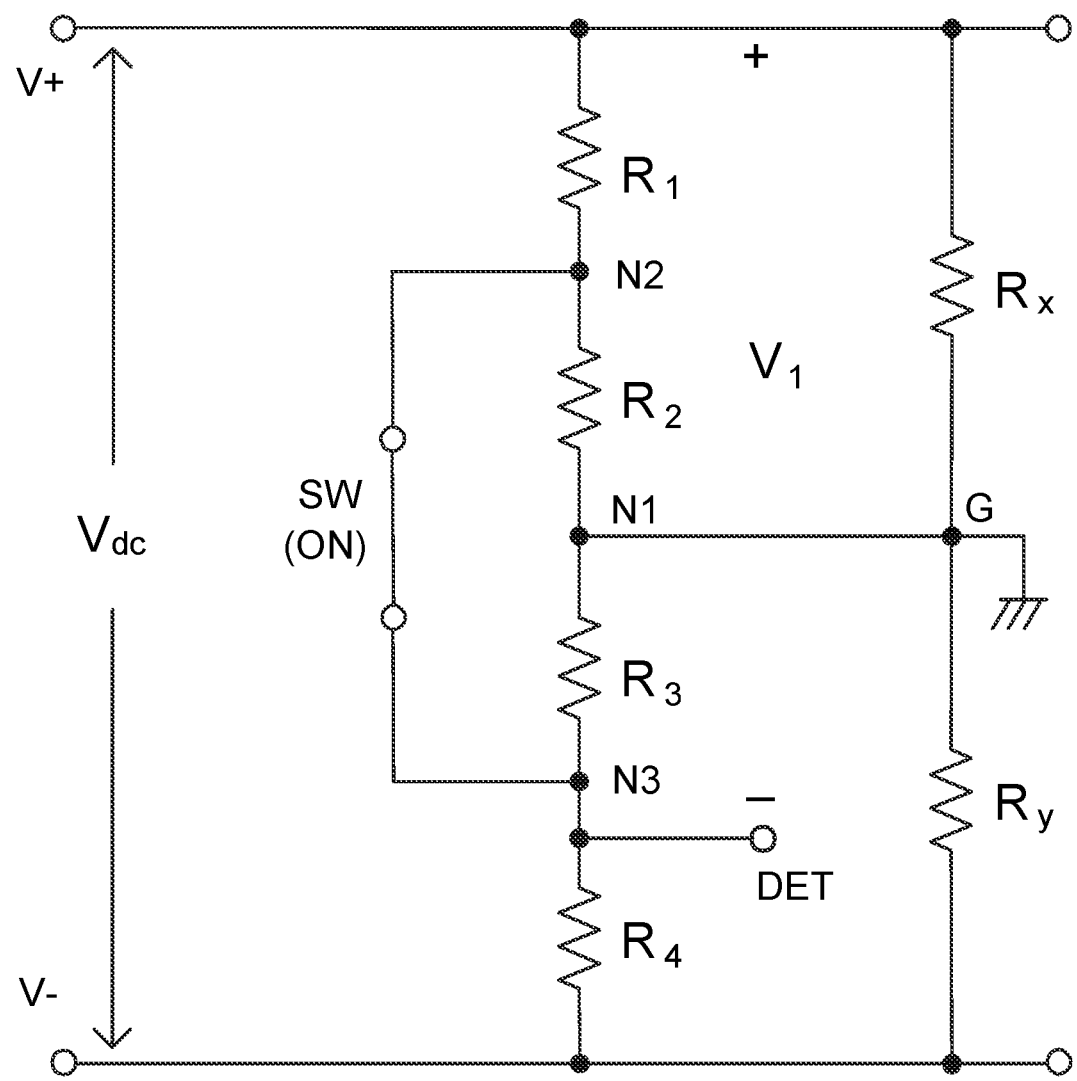
Figure 8C:
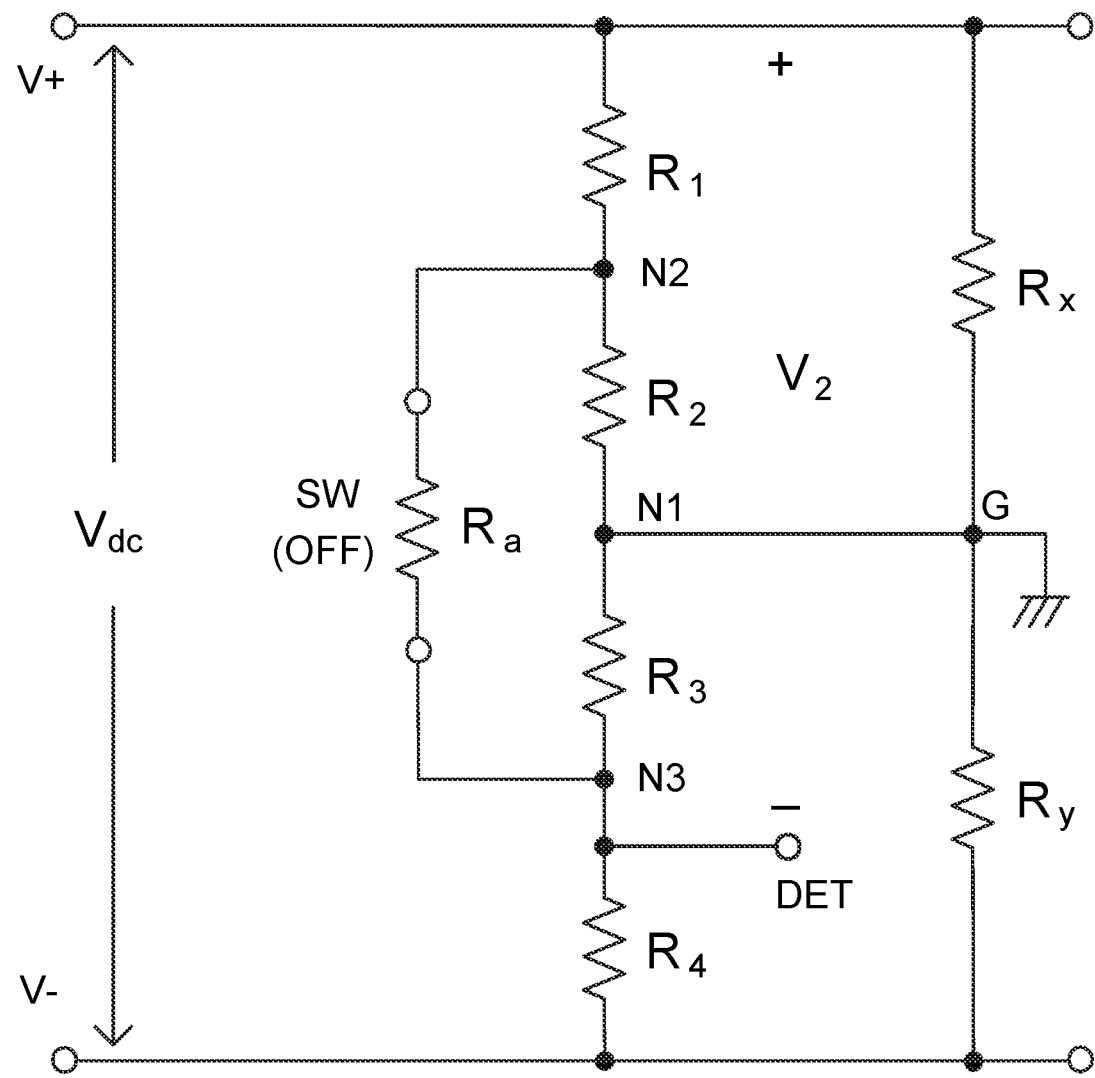
FIG. 8C is a circuit diagram when the switch in FIG. 8A is turned off.

Please refer to FIG. 3A, which shows a circuit diagram of the insulation resistance detection circuit according to a second embodiment of the present disclosure. The major difference between FIG. 3A and FIG. 2A is that the insulation resistance detection circuit further includes a first circuit bypass capacitance Cx and a second circuit bypass capacitance Cy. The circuit bypass capacitance is also known as Y capacitance. The first circuit bypass capacitance Cx is coupled in parallel to the first resistance R1 and the second resistance R2 in series, and the second circuit bypass capacitance Cy is coupled in parallel to the third resistance R3 and the fourth resistance R4 in series. In particular, the first resistance R1 and the second resistance R2 are used for the first circuit bypass capacitance Cx discharging to the ground point G, and the third resistance R3 and the fourth resistance R4 are used for the second circuit bypass capacitance Cy discharging to the ground point G. That is, when the first circuit bypass capacitance Cx needs to be discharged, it can be discharged through a path from the first resistance R1 and the second resistance R2 to the ground point G. Similarly, when the second circuit bypass capacitance Cy needs to be discharged, it can be discharged through a path from the third resistance R3 and the fourth resistance R4 to the ground point G.

Under the same principle and technical spirit, FIG. 4 (i.e., including FIG. 4A to FIG. 4C), FIG. 5 (i.e., including FIG. 5A to FIG. 5C), FIG. 6 (i.e., including FIG. 6A to FIG. 6C), and FIG. 7 (i.e., including FIG. 7A to FIG. 7C) and FIG. 8 (i.e., including FIG. 8A to FIG. 8C) express different embodiments of the present disclosure, including the technical solutions with the first circuit bypass capacitance Cx and the second circuit bypass capacitance Cy which are not shown. The major difference is that the detection unit DET is arranged/disposed at different detection positions to measure different first voltages V1 (when switch SW is turned on) and second voltages V2 (when switch SW is turned off).

In FIG. 4, the detection unit DET is coupled between the first node N1 and the negative end V−, and is used to detect a voltage across the third resistance R3 and the fourth resistance R4 as the first voltage V1 and the second voltage V2. Similarly, the third voltage (i.e., the calculated first voltage) and the fourth voltage (i.e., the calculated second voltage) are respectively calculated respectively according to the first estimated resistance and the second estimated resistance. The third voltage can be calculated by relationship (2-1), that is:

$$V_1 = V_{dc} \times \frac{(R_{42//3}//R_y)}{(R_{42//3}//R_y) + (R_{12//3}//R_x)} \quad \text{relationship (2-1)}$$

The fourth voltage can be calculated by relationship (2-2), that is:

$$V_2 = V_{dc} \times \frac{(R_{43a}//R_y)}{(R_{12a}//R_x) + (R_{43a}//R_y)} \quad \text{relationship (2-2)}$$

Finally, determining whether the third voltage is equal to the first voltage, determining whether the fourth voltage is equal to the second voltage when the third voltage is equal to the first voltage, and accurately detecting the positive insulation resistance and the negative insulation resistance when the fourth voltage is equal to the second voltage.

In FIG. 5, the detection unit DET is coupled between the second node N2 and the negative end V−, and is used to detect a voltage across the second resistance R2 and the fourth resistance R4 as the first voltage V1 and the second voltage V2. Similarly, the third voltage (i.e., the calculated first voltage) and the fourth voltage (i.e., the calculated second voltage) are respectively calculated respectively according to the first estimated resistance and the second estimated resistance. The third voltage can be calculated by relationship (3-1), that is:

$$V_1 = V_{dc} \times \frac{(R_{y2//3}//R_4)}{(R_{x2//3}//R_1) + (R_{y2//3}//R_4)} \quad \text{relationship (3-1)}$$

The fourth voltage can be calculated by relationship (3-2), that is:

$$V_2 = V_{dc} \times \left(1 - \frac{((R_1 + R_{2a})//R_{x23})}{((R_1 + R_{2a})//R_{x23}) + ((R_{3a} + R_4)//R_{y23})}\right) \times \frac{R_1}{R_1 + R_{2a}} \quad \text{relationship (3-2)}$$

Finally, determining whether the third voltage is equal to the first voltage, determining whether the fourth voltage is equal to the second voltage when the third voltage is equal to the first voltage, and accurately detecting the positive insulation resistance and the negative insulation resistance when the fourth voltage is equal to the second voltage.

In FIG. 6, the detection unit DET is coupled between the positive end V+ and the second node N2, and is used to detect a voltage across two ends of the first resistance R1 as the first voltage V1 and the second voltage V2. Similarly, the third voltage (i.e., the calculated first voltage) and the fourth voltage (i.e., the calculated second voltage) are respectively calculated respectively according to the first estimated resistance and the second estimated resistance. The third voltage can be calculated by relationship (4-1), that is:

$$V_1 = V_{dc} \times \frac{(R_{x2//3}//R_1)}{(R_{x2//3}//R_1) + (R_{y2//3}//R_4)} \quad \text{relationship (4-1)}$$

The fourth voltage can be calculated by relationship (4-2), that is:

$$V_2 = V_{dc} \times \frac{((R_1 + R_{2a})//R_{x23})}{((R_4 + R_{3a})//R_{y23}) + ((R_1 + R_{2a})//R_{x23})} \times \frac{R_1}{R_1 + R_{2a}} \quad \text{relationship (4-2)}$$

Finally, determining whether the third voltage is equal to the first voltage, determining whether the fourth voltage is equal to the second voltage when the third voltage is equal to the first voltage, and accurately detecting the positive insulation resistance and the negative insulation resistance when the fourth voltage is equal to the second voltage.

In FIG. 7, the detection unit DET is coupled between the positive end V+ and the first node N1, and is used to detect a voltage across the first resistance R1 and the second resistance R2 as the first voltage V1 and the second voltage V2. Similarly, the third voltage (i.e., the calculated first voltage) and the fourth voltage (i.e., the calculated second voltage) are respectively calculated respectively according to the first estimated resistance and the second estimated resistance. The third voltage can be calculated by relationship (5-1), that is:

$$V_1 = V_{dc} \times \frac{(R_{12//3}//R_x)}{(R_{42//3}//R_y) + (R_{12//3}//R_x)} \quad \text{relationship (5-1)}$$

The fourth voltage can be calculated by relationship (5-2), that is:

$$V_2 = V_{dc} \times \frac{(R_{12a}//R_x)}{(R_{12a}//R_x) + (R_{43a}//R_y)} \quad \text{relationship (5-2)}$$

Finally, determining whether the third voltage is equal to the first voltage, determining whether the fourth voltage is equal to the second voltage when the third voltage is equal to the first voltage, and accurately detecting the positive insulation resistance and the negative insulation resistance when the fourth voltage is equal to the second voltage.

In FIG. 8, the detection unit DET is coupled between the positive end V+ and the third node N3, and is used to detect a voltage across the first resistance R1 and the third resistance R3 as the first voltage V1 and the second voltage V2. Similarly, the third voltage (i.e., the calculated first voltage) and the fourth voltage (i.e., the calculated second voltage) are respectively calculated respectively according to the first estimated resistance and the second estimated resistance. The third voltage can be calculated by relationship (6-1), that is:

$$V_1 = V_{dc} \times \frac{(R_{x2//3}//R_1)}{(R_{x2//3}//R_1) + (R_{y2//3}//R_4)} \quad \text{relationship (6-1)}$$

The fourth voltage can be calculated by relationship (6-2), that is:

$$V_2 = V_{dc} \times \left(1 - \frac{((R_4 + R_{3a})//R_{y23})}{((R_1 + R_{2a})//R_{x23}) + ((R_4 + R_{3a})//R_{y23})}\right) \times \frac{R_4}{R_4 + R_{3a}} \quad \text{relationship (6-2)}$$

Finally, determining whether the third voltage is equal to the first voltage, determining whether the fourth voltage is equal to the second voltage when the third voltage is equal to the first voltage, and accurately detecting the positive insulation resistance and the negative insulation resistance when the fourth voltage is equal to the second voltage.

In summary, the present disclosure has the following features and advantages:

1. The insulation resistance detection circuit and the method of detecting insulation resistance of the present disclosure may be applied to the DC end of power products, such as but not limited to solar panels, batteries, or multiple power modules.

2. The insulation resistance detection circuit of the present disclosure is mainly composed of the first resistance R1 to the fourth resistance R4 and the switch SW so the circuit structure is simplified and the circuit cost can be reduced.

3. Any one of the first resistance R1 to the fourth resistance R4 in the present disclosure may be composed of more than a plurality of actual resistors.

4. The switch SW may be any semiconductor component (MOSFET, IGBT, etc.) or a photo coupler.

5. Compared with the current structure, the proposed feedback voltage position is to measure the negative end of the circuit.

6. The equivalent equations of the first voltage V1 and the second voltage V2 in the detection circuit are acquired by turning on and turning off the switch SW.

7. The resistance tracking method is performed through the controller, and the first estimated resistance and the second estimated resistance are tracked and compared to acquire a unique solution.

8. Compared with the Wheatstone voltage structure of the current technology, the feedback voltage accuracy is higher, which means that the error range is small.

9. In the embodiment where the feedback voltage is connected to the negative end of the DC side, the noise interference will be smaller.

10. The series-connected resistance may be used as the balance resistance between the positive end and the negative end of the DC side to the ground, and the discharge resistance of the Y capacitance.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. An insulation resistance detection circuit, coupled to a positive end and a negative end of a DC power source, and configured to detect a positive insulation resistance between the positive end and a ground point, and a negative insulation resistance between the negative end and the ground point, the insulation resistance detection circuit comprising:
   a first resistance, a second resistance, a third resistance, and a fourth resistance coupled in series, and a first node between the second resistance and the third resistance coupled to the ground point,
   a first circuit bypass capacitance and a second circuit bypass capacitance, the first circuit bypass capacitance coupled in parallel to the first resistance and the second resistance in series, and the second circuit bypass capacitance coupled in parallel to the third resistance and the fourth resistance in series,
   a switch comprising a first end and a second end, the first end coupled to a second node between the first resistance and the second resistance, and the second end coupled to a third node between the third resistance and the fourth resistance, and
   a detection unit coupled to any two of the positive end, the negative end, the first node, the second node, and the third node,
   wherein the first resistance and the second resistance are configured for the first circuit bypass capacitance discharging to the ground point, the third resistance and the fourth resistance are configured for the second circuit bypass capacitance discharging to the ground point.

2. The insulation resistance detection circuit as claimed in claim 1, wherein the detection unit acquire a first voltage based on turning on the switch and acquire a second voltage based on turning off the switch.

3. The insulation resistance detection circuit as claimed in claim 2, wherein the detection unit is configured to set a first estimated resistance of the positive insulation resistance and a second estimated resistance of the negative insulation resistance,
   wherein the detection unit is configured to calculate a third voltage and a fourth voltage according to the first estimated resistance and the second estimated resistance so as to detect the positive insulation resistance and the negative insulation resistance when the third voltage is equal to the first voltage and the fourth voltage is equal to the second voltage.

4. The insulation resistance detection circuit as claimed in claim 3, wherein when the third voltage is not equal to the first voltage, the first estimated resistance is adjusted so that the third voltage is equal to the first voltage; when the fourth voltage is not equal to the second voltage, the second estimated resistance is adjusted so that the fourth voltage is equal to the second voltage.

5. The insulation resistance detection circuit as claimed in claim 3, wherein when the third voltage is equal to the first voltage and the fourth voltage is equal to the second voltage, the first estimated resistance is the positive insulation resistance, and the second estimated resistance is the negative insulation resistance.

6. The insulation resistance detection circuit as claimed in claim 2, wherein the detection unit is coupled between the third node and the negative end,
   wherein when the switch is turned on, the detection unit detects that a voltage across two ends of the fourth resistance is the first voltage; when the switch is turned off, the detection unit detects that the voltage across two ends of the fourth resistance is the second voltage.

7. The insulation resistance detection circuit as claimed in claim 2, wherein the detection unit is coupled between the first node and the negative end,
   wherein when the switch is turned on, the detection unit detects that a voltage across the third resistance and the fourth resistance is the first voltage; when the switch is turned off, the detection unit detects that the voltage across the third resistance and the fourth resistance is the second voltage.

8. The insulation resistance detection circuit as claimed in claim 2, wherein the detection unit is coupled between the second node and the negative end,
   wherein when the switch is turned on, the detection unit detects that a voltage across the second resistance and the fourth resistance is the first voltage; when the switch is turned off, the detection unit detects that the voltage across the second resistance and the fourth resistance is the second voltage.

9. The insulation resistance detection circuit as claimed in claim 2, wherein the detection unit is coupled between the positive end and the second node,
   wherein when the switch is turned on, the detection unit detects that a voltage across two ends of the first resistance is the first voltage; when the switch is turned off, the detection unit detects that the voltage across two ends of the first resistance is the second voltage.

10. The insulation resistance detection circuit as claimed in claim 2, wherein the detection unit is coupled between the positive end and the first node,
    wherein when the switch is turned on, the detection unit detects that a voltage across the first resistance and the second resistance is the first voltage; when the switch is turned off, the detection unit detects that the voltage across the first resistance and the second resistance is the second voltage.

11. The insulation resistance detection circuit as claimed in claim 2, wherein the detection unit is coupled between the positive end and the third node,
    wherein when the switch is turned on, the detection unit detects that a voltage across the first resistance and the third resistance is the first voltage; when the switch is turned off, the detection unit detects that the voltage across the first resistance and the third resistance is the second voltage.

* * * * *